(12) United States Patent
Schroeder et al.

(10) Patent No.: US 11,170,139 B1
(45) Date of Patent: Nov. 9, 2021

(54) REAL-TIME ACOUSTICAL RAY TRACING

(71) Applicant: Apple Inc., Cupertino, CA (US)

(72) Inventors: Dirk Schroeder, San Jose, CA (US); Soenke Pelzer, San Jose, CA (US)

(73) Assignee: Apple Inc., Cupertino, CA (US)

( * ) Notice: Subject to any disclaimer, the term of this patent is extended or adjusted under 35 U.S.C. 154(b) by 267 days.

(21) Appl. No.: 15/900,862

(22) Filed: Feb. 21, 2018

Related U.S. Application Data

(60) Provisional application No. 62/513,410, filed on May 31, 2017.

(51) Int. Cl.
| | |
|---|---|
| *G06T 15/06* | (2011.01) |
| *G06F 30/20* | (2020.01) |
| *G06F 17/18* | (2006.01) |

(52) U.S. Cl.
CPC .............. *G06F 30/20* (2020.01); *G06F 17/18* (2013.01); *G06T 15/06* (2013.01)

(58) Field of Classification Search
CPC ........... H04S 7/301; H04S 7/00; G01K 15/02; G01K 15/08; G01K 11/30; G06T 15/06; G01N 29/14; G01H 7/00; G06F 30/20
See application file for complete search history.

(56) References Cited

U.S. PATENT DOCUMENTS 5,528,557 A * 6/1996 Horn ...................... G01N 29/14
 367/129
5,627,899 A 5/1997 Craven
(Continued)

FOREIGN PATENT DOCUMENTS

| EP | 3016413 A1 | 5/2016 |
|---|---|---|
| WO | 2012007746 A1 | 1/2012 |
| WO | 2017007848 A1 | 1/2017 |

OTHER PUBLICATIONS

Markovic, et al., "3D Beam Tracing Based on Visibility Lookup for Interactive Acoustic Modeling," IEEE Transactions on Visualization and Computer Graphics, vol. 22, No. 10, Oct. 2016.
Pelzer, et al., "Integrating Real-Time Room Acoustics Simulation into a CAD Modeling Software to Enhance the Architectural Design Process," Buildings, 2014, 2, 11-138, doi:10.3390/buildings4020113.
(Continued)

*Primary Examiner* — Kandasamy Thangavelu
(74) *Attorney, Agent, or Firm* — Blank Rome LLP

(57) ABSTRACT

This disclosure relates to techniques for generating physically accurate auralization of sound propagation in complex environments, while accounting for important wave effects, such as sound absorption, sound scattering, and airborne sound insulation between rooms. According to some embodiments, techniques may be utilized to determine more accurate, e.g., "acoustically-effective" room volumes that account for open windows, open doors, acoustic dead space, and the like. According to other embodiments disclosed herein, techniques may be utilized to perform optimized hybrid acoustical ray tracing, including grouping coherent rays by processing core. According to other embodiments disclosed herein, techniques may be utilized to translate simulated ray tracing results into natural-sounding reverberations by deriving and resampling spatial-time-frequency energy probability density functions that more accurately account for the laws of physics and then converting this data into a spatial impulse response function, which may then be used for realistic 3D audio reproduction, e.g., via headphones or loudspeakers.

20 Claims, 13 Drawing Sheets

(56) References Cited

U.S. PATENT DOCUMENTS

| | | | |
|---|---|---|---|
| 6,973,192 | B1 | 12/2005 | Gerrard |
| 7,146,296 | B1* | 12/2006 | Carlbom .................. H04S 7/00 |
| | | | 703/5 |
| 7,535,351 | B2 | 5/2009 | Reymond |
| 8,705,757 | B1 | 4/2014 | Betbeder |
| 9,031,268 | B2 | 5/2015 | Fejzo |
| 9,584,938 | B2 | 2/2017 | Chafe |
| 2003/0007648 | A1 | 1/2003 | Currell |
| 2007/0237335 | A1 | 10/2007 | O'Sullivan |
| 2008/0156577 | A1* | 7/2008 | Dietz ..................... G10K 11/30 |
| | | | 181/176 |
| 2012/0016640 | A1* | 1/2012 | Murphy ................. G10K 15/02 |
| | | | 703/2 |
| 2012/0249556 | A1* | 10/2012 | Chandak ............... G10K 15/02 |
| | | | 345/473 |
| 2015/0230041 | A1 | 8/2015 | Fejzo |
| 2015/0378019 | A1* | 12/2015 | Schissler ................ G06T 15/06 |
| | | | 700/94 |
| 2016/0061597 | A1 | 3/2016 | De Bruijn |
| 2016/0109284 | A1* | 4/2016 | Hammershoi ........... G01H 7/00 |
| | | | 73/586 |
| 2016/0125871 | A1* | 5/2016 | Shirakihara ........... G10K 15/08 |
| | | | 381/63 |
| 2016/0301375 | A1 | 10/2016 | Watts |
| 2017/0078820 | A1* | 3/2017 | Brandenburg .......... H04S 7/301 |
| 2017/0165576 | A1 | 6/2017 | Ballard |
| 2018/0232471 | A1* | 8/2018 | Schissler ................ G06F 30/20 |

OTHER PUBLICATIONS

Pelzer, et al., "Interactive Real-Time Simulation and Auralization for Modifiable Rooms," Journal of Building Acoustics, vol. 21, No. 1, p. 65-73, Mar. 1, 2014.

Pelzer, et al., "Real-time room acoustics simulation for designing room acoustics, planning sound systems and 3-D audio production," Tonmeistertagung VDT International Convention, Nov. 20-23, 2014.

Schröder, Dirk, "Physically Based Real-Time Auralization of Interactive Virtual Environments," Feb. 4, 2011.

Schröder, et al., "Modeling (Non-)uniform scattering distributions in geometrical acoustics," Proceedings of Meetings on Acoustics, vol. 19, ICA 2013, Jun. 2-7, 2013, Montreal Canada.

Schröder, et al., "Through the Hourglass: A Faithful Audiovisual Reconstruction of the Old Montreux Casino," Acoustics Australia, Apr. 2015, vol. 43, Issue 1, pp. 49-57.

Shtrepi, et al., "Objective and perceptual assessment of the scattered sound field in a simulated concert hall," The Journal of Acoustical Society of America, 138, 1485 (2015).

Vorländer, et al., "Virutal reality for architectural acoustics," Journal of Building Performance Simulation, 8:1, 15-25, DOI: 10.1080/19401493.2014.888594, May 19, 2014.

Wefers, et al., "Interactive Acoustic Virtual Environments Using Distributed Room Acoustic Simulations," Proc. of the EAA Joint Symposium on Auralization and Ambisonics, Berlin, German, Apr. 3-5, 2014.

* cited by examiner

REAL-TIME ACOUSTICAL RAY TRACING

CROSS-REFERENCE TO RELATED APPLICATION

This application claims priority to U.S. Provisional Patent Application Ser. No. 62/513,410, filed May 31, 2017, and entitled, "Techniques for Improved Real-Time Auralization of Virtual 3D Environments" ("the '410 application"). The '410 application is also hereby incorporated by reference in its entirety.

TECHNICAL FIELD

This disclosure relates generally to the field of auralization. More particularly, but not by way of limitation, it relates to techniques for auralization of virtual 3D environments in real-time.

BACKGROUND

Over the past few decades, Virtual Reality (VR) and Augmented Reality (AR) technologies have emerged to be powerful tools for a wide variety of applications, e.g., in science, design, medicine, gaming and engineering, as well as in more visionary applications such as the creation of "virtual spaces" that aim to simulate the look and sound of their real world environment counterparts. However, most of the innovation in recent years has been focused on creating virtual visual renderings (e.g., VR headsets and video gaming systems, and the like). In order to increase the sense of immersion in such virtual environments to be as realistic of a simulation as possible, it is important to consider multiple sensory stimuli beyond just the simulation of visual stimuli, e.g., the simulation of sound stimuli—and even smell and/or touch stimuli.

Analogous to visualization, the so-called "auralization" of virtual environments describes the simulation of sound propagation inside enclosures, where methods of Geometrical Acoustics (GA) may be used for a high-quality synthesis of aural stimuli that mimic certain realistic behaviors of sound waves. In such simulations, spatial audio signals may be generated that take into account various models of sound wave reflections, as well as models of sound wave reverberations, in three-dimensional environments. Such spatial audio may be generated, e.g., using Digital Audio Workstation (DAW) software or the like, and may be used for various applications, such as room planning and/or musical or architectural sound simulations. Further details regarding the auralization of virtual environments may be found in the co-inventor's Ph.D. thesis: D. Schroeder, "Physically Based Real-Time Auralization of Interactive Virtual Environments," Ph.D. thesis, RWTH Aachen University, 2011 (hereinafter, "Schroeder").

Current implementations of spatial audio synthesis software can often manage the computational load of simulating moving sound sources around a moving receiver in real-time, however, these simulations are often based on a static reverberation. In a real-world scenario, however, there is significant interaction between sound waves and reflective/obstructive surfaces, e.g., when entering or exiting a room. Moreover, various portals in a room (e.g., doors, windows, roofs) may be dynamically opening and/or closing as a user (or virtual user) navigates a real-world (or virtual) environment listening to synthesized audio signals. Each of these changes in a room's architecture or scene composition can have a significant impact on the way that sound waves in the room should be simulated at any given instant in real-time.

Thus, there is a need for improved techniques for the physically accurate auralization of virtual 3D environments in real-time. This includes environments wherein any (or all) of: the sound sources, the sound receiver, and the geometry/surfaces in the virtual environment may be dynamically changing as the sound sources are being simulated. Such techniques may also be applied in Augmented Reality (AR) scenarios, e.g., wherein additional sound information is added to a listener's real-world environment to accurately simulate the presence of a "virtual" sound source that is not actually present in the listener's real-world environment; mixed reality scenarios; sound visualization applications; room planning; and/or 3D sound mixing applications.

SUMMARY

Electronic devices, computer readable storage media, and related methods are disclosed herein that are configured to generate a physically accurate auralization of sound propagation in complex environments, including important wave effects such as sound absorption, sound scattering, and airborne sound insulation between rooms. Such techniques may support not only a realistic sound field rendering, but also the simulation of spatially-distributed and freely-movable sound sources and receivers in real-time, as well as modifications and manipulations of the environment itself.

According to some embodiments disclosed herein, techniques may be utilized to determine a more accurate, e.g., "acoustically-effective" room volume. In particular, for certain 3D room models, it is hard to determine the room volume. This is especially true for convoluted spaces, holes (e.g., open windows) or even "half-open" spaces (e.g., stadiums). Many acoustical equations or algorithms require an accurate estimate of the room's (e.g., the environment's) volume. The acoustically-effective room volume estimation techniques disclosed herein can handle open and half-open spaces, open windows, convoluted spaces with unreachable corners—and can even detect the amount of volume that should be considered behind very small openings. Thus, the same acoustical equations or algorithms already used in the art can be significantly improved by using the acoustically-effective room volume estimate techniques described herein (as opposed to simple 3D model volume calculations). Use of the acoustically-effective room volume estimate will make these acoustical equations more accurate and more robust to errors, e.g., due to defective or undefined 3D room/environment models.

According to other embodiments disclosed herein, techniques may be utilized to perform optimized acoustical ray tracing. Fast and optimized ray tracing algorithms already exist in the graphics/optics field, but current acoustic adaptions either lack performance or physical accuracy. Thus, by considering acoustical wave propagation and the psycho-acoustic characteristics of human listeners, the improved ray tracing processes described herein are adapted to the problem of sound (e.g., rather than light) propagation. The improved ray tracer has increased suitability for acoustic purposes and boosts the performance at the same time.

According to still other embodiments disclosed herein, techniques may be utilized to translate simulated ray tracing results into natural-sounding reverberations that more-accurately account for the laws of physics. Many acoustic simulation algorithms in the prior art simply perform a direct transformation of the path of a bounced ray into a modeled room reflection. In such simulations, however, a ray cannot represent a reflection. Instead, the number of rays is set arbitrarily at the beginning of the simulation and held constant over time, while the number of room reflections is defined by the room's geometry (and not by the number of rays) and increases exponentially over time. By contrast, the improved techniques described herein define a transformation that is used to derive a spatial-time-frequency energy probability density function (PDF) during ray tracing that more accurately accounts for the laws of physics, and then convert this data into a spatial impulse response (SIR) function, which may then be used for realistic 3D audio reproduction, e.g., either via headphones or loudspeakers.

Various non-transitory program storage devices are also disclosed herein. Such program storage devices may be readable by one or more programmable control devices. Instructions may be stored on the program storage device for causing the one or more programmable control devices to: obtain a first one or more room parameters for a first room; determine a first location of a first detector in the first room; determine a first plurality of rays to be launched from a second location in the first room; sort the first plurality of rays into a second plurality of ray groups, wherein each group of rays in the second plurality comprises a plurality of coherent rays; simulate the launch of the second plurality of ray groups into the first room from the second location, wherein each group of rays in the second plurality is simulated in parallel using a different compute core; and detect rays from the second plurality of ray groups that return to the first detector, wherein detecting rays from the second plurality of ray groups comprises each compute core independently storing frequency, time, and directional information for each ray it simulated that returns to the first detector.

Other embodiments of non-transitory program storage devices are also disclosed. In one such embodiment, instructions are stored on the program storage device for causing one or more programmable control devices to: obtain a first one or more room parameters for a first room; determine a first location of a first detector in the first room; determine a first plurality of acoustic rays to be launched from a second location in the first room; obtain an energy density function, wherein the energy density function is representative of frequency, time, and directional information of the first plurality of acoustic rays launched from the second location and received at the first detector; generate a first plurality of evenly-distributed random numbers over a first range of values; sample the energy density function based, at least in part, on the generated first plurality of evenly-distributed random numbers and the obtained one or more room parameters to synthesize an SIR function; and convolve the generated SIR function with an input audio signal to generate an output audio signal.

Still other embodiments of non-transitory program storage devices are also disclosed. In one such embodiment, instructions are stored on the program storage device for causing one or more programmable control devices to: obtain a first one or more room parameters for a first room; determine a first acoustically-agnostic room volume estimate for the first room using the obtained first one or more room parameters; adjust the first acoustically-agnostic room volume estimate to determine an acoustically-effective room volume by accounting for one or more acoustically-relevant room features in the first room, wherein accounting for the one or more acoustically-relevant room features comprises taking one or more of the following exemplary actions: accounting for an open window in the first room; accounting for an open door in the first room connecting the first room to a second room; and ignoring one or more regions of the first room that are reached by an amount of acoustic energy that is less than a threshold.

Various methods of improving real-time auralization of virtual 3D environments are also disclosed herein, in accordance with the various program storage device embodiments enumerated above.

Various electronic devices are also disclosed herein, in accordance with the various program storage device embodiments enumerated above. Such electronic devices may include one or more auditory sensors, camera units, biometric sensors, tracking devices, speakers or other audio reproduction circuits, and/or displays; a programmable control device; and a memory coupled to the programmable control device. Instructions are stored in the memory, the instructions causing one or more programmable control devices to perform techniques in accordance with the program storage device embodiments enumerated above.

DETAILED DESCRIPTION

In the following description, for purposes of explanation, numerous specific details are set forth in order to provide a thorough understanding of the invention. It will be apparent, however, to one skilled in the art that the invention may be practiced without these specific details. In other instances, structure and devices are shown in block diagram form in order to avoid obscuring the invention. References to numbers without subscripts or suffixes are understood to reference all instances of subscripts and suffixes corresponding to the referenced number. Moreover, the language used in this disclosure has been principally selected for readability and instructional purposes, and may not have been selected to delineate or circumscribe the inventive subject matter, resort to the claims being necessary to determine such inventive subject matter. Reference in the specification to "one embodiment" or to "an embodiment" means that a particular feature, structure, or characteristic described in connection with the embodiments is included in at least one embodiment of the invention, and multiple references to "one embodiment" or "an embodiment" should not be understood as necessarily all referring to the same embodiment.

Figure 1:
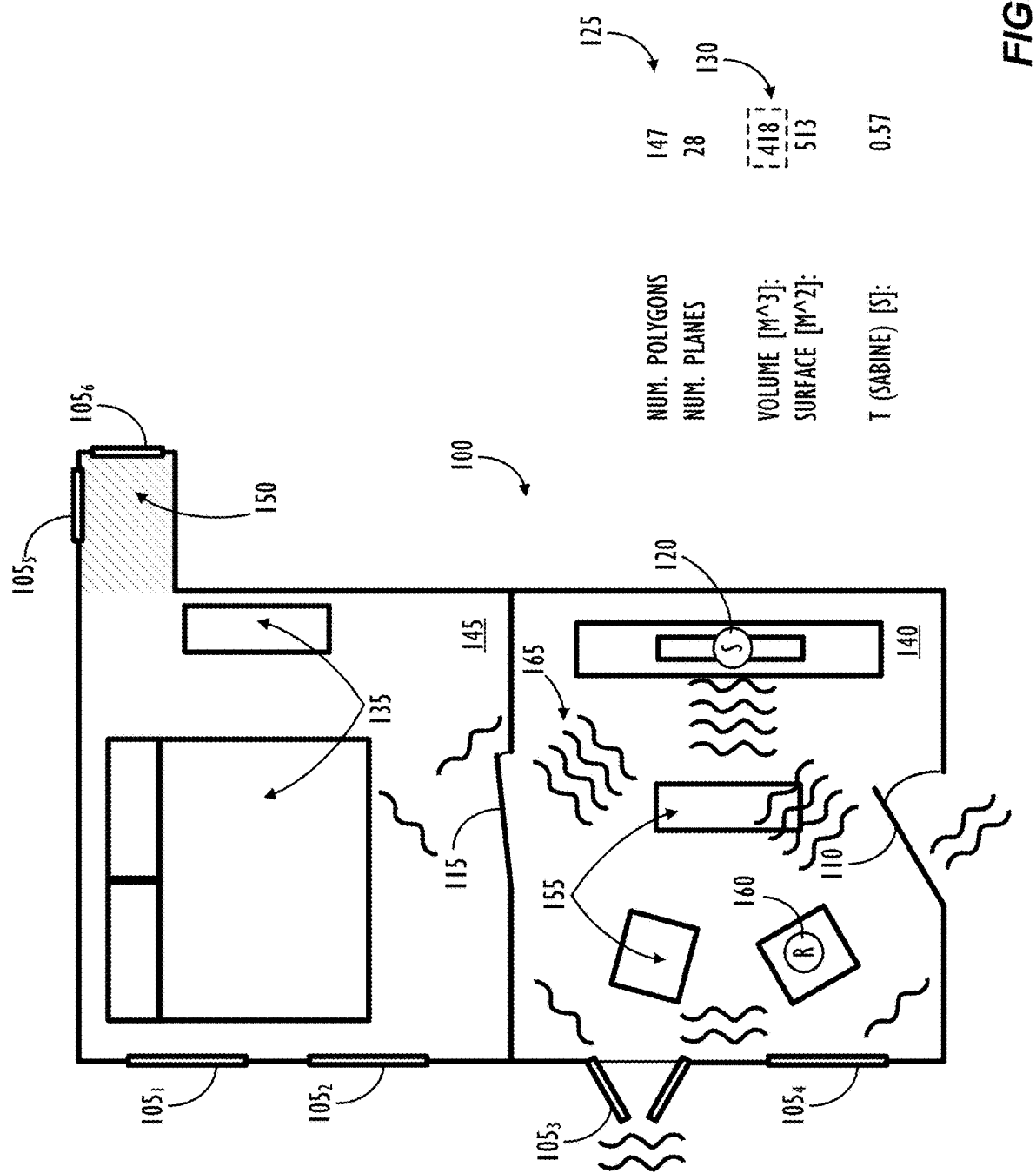
FIG. 1 shows an exemplary acoustic room model and the corresponding specification of the room model.

As mentioned above, the techniques disclosed herein relate to improved systems, devices, and methods for the physically accurate auralization of virtual 3D environments in real-time. Turning now to FIG. 1, a top-down view of an exemplary 3D acoustic room model 100 and the corresponding specifications 125 of the room model are shown. Room 100 may comprise, e.g., a virtual environment for which it is desired to simulate physically accurate sound signals in real-time. The room specifications 125 may comprise: a number of polygons with assigned surface materials making up the room; a number of planes; a volume estimate of the room (130); a surface area of the room; and a so-called "Sabine" time, which is an estimated amount of reverberation time for the room. Sabine time may be derived from volume and equivalent absorption area measurements of the environment.

As shown in FIG. 1, a room model may comprise one or more rooms (e.g., rooms 140 and 145), one or more windows (e.g., windows $105_1$-$105_6$), one or more doors (110 and 115) pieces of furniture (e.g., 135 and 155), and the like. In certain 3D room models, the elements of the room may be constructed out of 3D polygon shapes having certain sizes, volumes, orientations, and placement, etc. in the room model. Moreover, the surface materials covering the various polygons in the room model may also be specified, so that sound reflections may be more accurately modeled when simulated acoustical rays intersect with the various polygons of the room model.

Also shown in room model 100, for explanatory purposes, are exemplary sounds source 120 and exemplary sound receiver (e.g., detector) 160. Various exemplary sounds rays 165 are shown as emitting from sound source 120 and reflecting around rooms 140 and 145. As is illustrated, some sound rays may exit the room model, e.g., via an open window ($105_3$) or open door (110). Likewise, a closed door between two rooms may acoustically separate the two rooms for simulation purposes. However, a door that is open or slightly ajar (e.g., door 115) and that is connecting a room with the simulated sound source located in it to another room may allow some sound rays to pass from a first room (e.g., room 140) into a second room (e.g., 145) or travel (e.g., through a wall structure) to a completely different location, which will have a perceptual impact on a sound detector located in either room.

An Acoustically Effective Room Volume Estimate

In typical prior art simulation methods, the room volume estimate (130) is purely a mathematical calculation based on the size and configuration of the polygons making up the room model. In other words, such models cannot account for variations in the room model that may have significant impact on a listener's ability to perceive sound in the room. This is especially true for so-called convoluted spaces (e.g., rooms with many corners and other irregularly shaped walls, etc.), holes in the room model through which sounds can escape (e.g., open windows) or even "half-open" spaces with walls but no ceiling (e.g., stadiums). The acoustically-effective room volume estimation techniques disclosed herein can handle open and half-open spaces, open windows, convoluted spaces with unreachable corners (e.g., corner 150 in room 145 of FIG. 1)—and can even detect the amount of volume that should be considered "acoustically relevant" behind very small openings (e.g., a door that is cracked open leading to a neighboring room).

There are well-known acoustic formulae that link room volume and room surface to the so-called "Mean Free Path" (MFP) of a room. The MFP is defined as the average distance between two reflections of sound waves in the room. Thus, a room acoustics simulation algorithm may be run to generate all room reflections from a certain sound source, the average distance between all reflections can be calculated and, from this average, e.g., the MFP of the room, and a converged value for the acoustically-relevant surfaces in the room, a room volume estimate may be calculated. In an acoustic setting (as opposed to an optical ray tracing setting), the directions in which the acoustic rays are reflected are different, which affects the distance between reflections, and therefore are directly linked to the MFP (e.g., the component that is needed to derive the room volume or room surface estimate).

There are various approaches to calculating room volume. For example, when using the quasi-standard volume estimation algorithm by Cohen and Hickey ("Summing the volumes of simplices"), the room model may be represented as a plurality of individual polygons making up the various surfaces in the room. Then, for each polygon, each of the polygon's vertices may be connected with an arbitrary fixed point in space, in order to form a polyhedron. Next, a so-called "signed volume" may be calculated for each polyhedron. The magnitude of the signed volume is the volume of the polyhedron, and the sign is determined by the side of the arbitrary fixed point with respect to the polygon's normal vector. The total volume of the room, then, may be determined by calculating the sum of all the polyhedrons' signed volumes. In some instances, it may be necessary to use the absolute value of the sum (e.g., depending on the normal vector convention that is used in a given implementation).

In some room models, for example, if there are two separate rooms with a polygon in the middle (e.g., splitting the space into two smaller rooms), such an approach would not necessarily give the relevant acoustic volume. Likewise, if there's an open window in the room, the volume estimate will not be acoustically accurate. As another example, two rooms with a door between them that is slightly ajar will be treated mathematically as a connected volume, but, acoustically, they are effectively two separate volumes (since very little acoustic energy will make it through the gap in the door, and most others will be reflected around the respective room that they originated from).

By contrast, the 'acoustically effective' room volume estimation methods described herein would be able to find the relevant acoustic volume of each of the rooms (e.g., in the example of the two rooms connected by a slightly ajar door). Such an estimation process is much more accurately acoustically-founded because it takes into account the actual behavior of acoustic waves, in terms of reflection and scattering. Thus, the same acoustical equations or algorithms already used in the art can be significantly improved by using the acoustically-effective room volume estimate techniques described herein (as opposed to simple 3D model volume calculations). Use of the acoustically-effective room volume estimate will make these acoustical equations more accurate and more robust to errors, e.g., due to defective or undefined 3D room/environment models.

Figure 2:
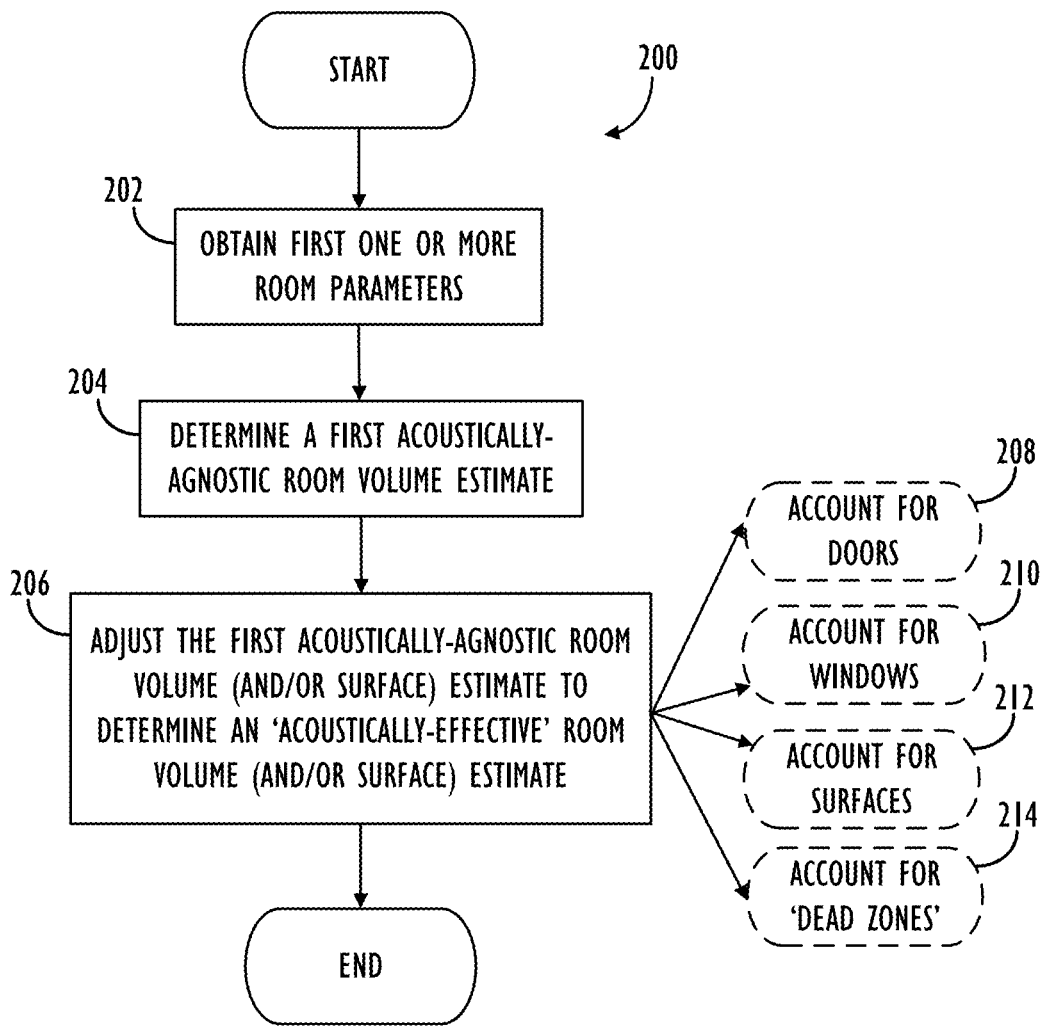
FIG. 2 is a flowchart illustrating one method of estimating an acoustically-effective room volume, according to one or more embodiments.

Turning now to FIG. 2, a flowchart illustrating one method 200 of estimating an acoustically-effective room volume is shown, according to one or more embodiments. First, at block 202, the method initiates by obtaining one or more room parameters. This may include the room model, polygon listings, surface materials, etc. for the room. Next, at block 204, the process determines a first 'acoustically agnostic' room volume estimate, that is, the purely mathematical room volume estimate, such as room volume estimate 130 in FIG. 1. Finally, the first 'acoustically agnostic' room volume (and/or surface) estimate may be adjusted to determine an 'acoustically effective' room volume (and/or surface) estimate. As mentioned above, this adjustment process may take into account, e.g.: open doors (208), open windows (210), surface materials (212), and/or acoustic 'dead zones' within the room (214), e.g., regions within the room that are reached by an amount of acoustic energy that is less than a determined threshold amount, e.g., regions of the room that may be unreachable by acoustic rays due to the room's geometry and/or the source orientation or positioning. According to some embodiments, the determined threshold may comprise a user-defined threshold. According to other embodiments, the determined threshold may reflect the physiological threshold of human hearing, e.g., zero decibels (dB).

An Improved Acoustic Real-Time Ray Tracer

Sound propagation in a certain medium is described by the wave equation, which is a second-order linear partial differential equation of waves. This equation has to be solved in order to determine the Room Impulse Response (RIR), but usually no analytic solutions exist, apart from simple case studies. Thus, the solutions must be approximated, which is usually done by means of basically two different approaches: wave-based methods and methods of Geometrical Acoustics, or combinations of both.

In real-time auralization applications, a separate handling of the specular and diffuse part of the SIR may be advantageous to gain filter update rates that correspond to human perception. Thus, a hybrid method of GA, which combines the Image Source method for early specular reflections with stochastic ray tracing, as well as a secondary source model for sound transmission, will be described further herein. The secondary source model may utilize room acoustical simulations and filter functions from interpolated spectra of transmission coefficients for rendering auralization filter networks in (but not limited to) multi-room situations. Additional background information regarding hybrid methods may be found, e.g., in Schroeder at Section 5.2.2.

According to some embodiments, multi-dimensional histograms may be generated by the ray tracing (RT) simulation. The histograms may track, over time, both the frequency bands of the received sound energy, as well as the frequency-dependent energy levels of the received sound energy. According to some embodiments, a Probability Density Function (PDF) may be generated, wherefrom directions of incoming sound waves may be derived based on the amount of energy, regardless of their frequency. A spectral "Energy Decay Curve" (EDC), which may also be represented as "EDC(t, f)" to reflect its dependency on time and frequency data, may then be derived from the frequency-dependent data, regardless of direction, thereby, in combination, fully characterizing the results of the ray tracing simulation in the room model.

According to some embodiments, for increased accuracy, the ray tracing detectors in the room may be modeled as having either a volume or a surface, so that it can be determined when (and whether) an incident ray bouncing around a room environment would be "heard" by a given detector "listening" to the room. Many different forms of detectors may be modeled (e.g., spheres, cubes, surfaces, etc.), depending on the needs and/or processing capabilities of a given ray tracing implementation.

Types of general information that may be stored for a particle that is subject to a ray tracing simulation may include, e.g., spectral energy level, starting point, ending point, travel direction, propagation time, last hit surface, etc. Supplemental information on the particle's reflection history may also be stored along with the particle's general information. In this way, each energy particle becomes an independent data entity that carries all required information for handling the respective particle propagation during the simulation, which also includes decisions about whether the particle may be counted by a detector that intersects with the current reflection path.

Once a more acoustically-accurate ray tracing simulation has been run (e.g., the types of ray tracing simulations described herein) and all returned sound energy information has been collected, a more accurate Mean Free Path estimate for the room—and, thus, a more accurate room volume estimate—may be obtained.

Figure 3:
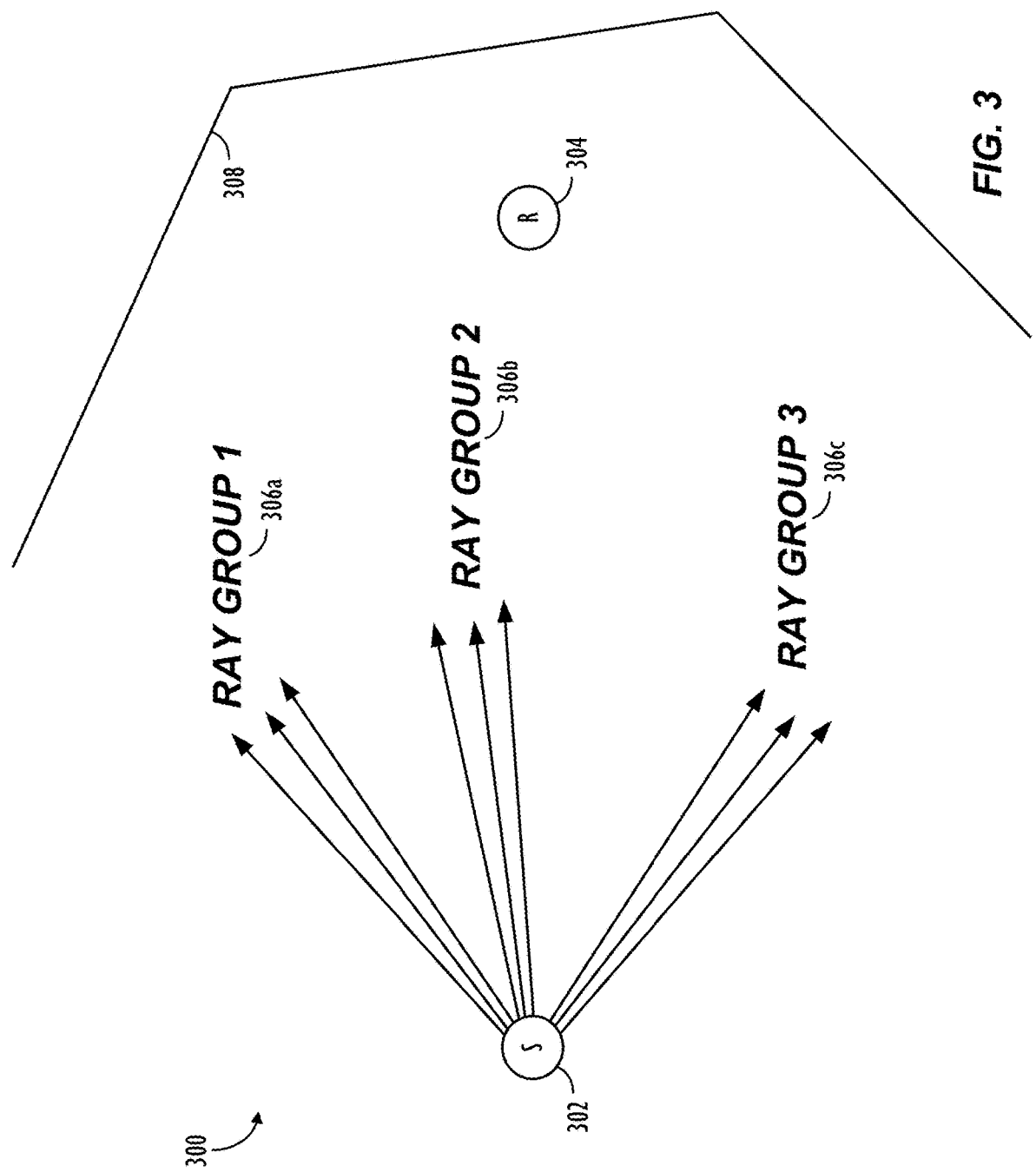
FIG. 3 is an example of coherent ray groups for parallelized processing, according to one or more embodiments.

Turning now to FIG. 3, an example 300 of so-called coherent ray groups 306 that have been optimized for parallelized processing is shown, according to one or more embodiments. In example 300, a sound source, S (302), is shown as emitting a plurality of sound rays, which may or may not eventually be received at receiver, R (304). As shown in the example 300, the plurality of rays are grouped into a second plurality of groups: "Ray Group 1" (306a), "Ray Group 2" (306b), and "Ray Group 3" (306c). Each of these groups may be said to possess "coherent" rays, that is, rays that are initially launched within a threshold number of degree as each other (e.g., before they are reflected around the room, thus changing directions). In fact, coherent rays are likely to hit the same polygon or polygons in the room (e.g., a particular polygon or polygons making up a wall surface 308 in the room)—and may even remain a bundle of coherent rays after being reflected (non-diffusely) off a room surface.

As described herein, each simulated audio ray can be calculated independently of each other. Thus, as shown in FIG. 3, according to some embodiments, simulated rays are not launched randomly in all directions (as is typically done in prior art implementations); rather, all the rays that will be launched may be "pre-sorted" by launch direction. Then, when using a CPU with multiple cores to run the ray tracing simulation, each core may simulate the launch of a group of rays having some coherence, e.g., so that each core is shooting rays in substantially the same direction (e.g., Ray Group 1 306a simulated by CPU Core 1, Ray Group 2 306b simulated by CPU Core 2, and Ray Group 3 306c simulated by CPU Core 3, etc.). This helps give the CPU the necessary data it needs in cache memory, which is much faster than main memory.

Figure 4:
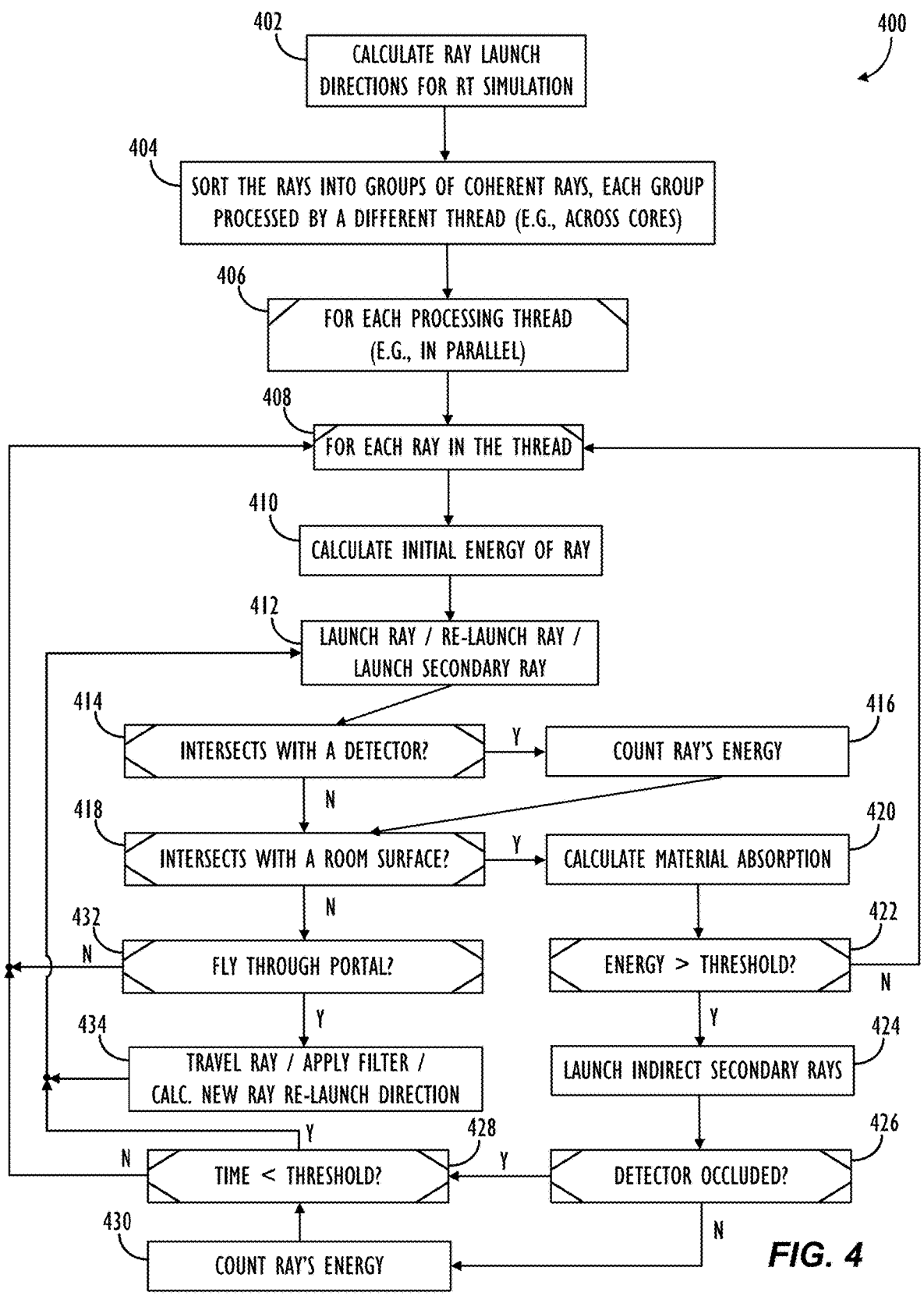
FIG. 4 is a flowchart illustrating one method of performing a ray tracing algorithm, according to one or more embodiments.

Turning now to FIG. 4, a flowchart 400 illustrating one method of performing a ray tracing algorithm is illustrated, according to one or more embodiments. First, the Ray Tracing process begins at block 402 by calculating the ray launch directions for every acoustical ray that will be launched in the ray tracing simulation. Next, the method may sort the rays into individual groups of coherent rays (block 404). According to some embodiments, each group of coherent rays may be simulated using a different processing thread of operations. According to further embodiments each processing thread for ray simulations may be executed by a different processing core, e.g., across multiple cores of the same multi-core computing device, across cores of multiple single-core computing devices, or across multiple cores of multiple multi-core computing devices.

Next, the iterative, parallel, ray tracing simulation may begin, e.g., with each processing thread (block 406) iteratively simulating the launching of each of the rays grouped into the given thread (block 408). As mentioned above, the various processing threads may be being simulated in parallel, e.g., across multiple computational cores.

For each given ray being simulated, the process may begin at block 410 by calculating the initial energy of the given ray about to be launched. Next, at block 412, the simulator may launch the given ray. According to some embodiments, the simulator may choose a certain absorption level to be applied to the simulated launched ray. This level may be based, e.g., on the types of sound source directivity found in the room model. Then, using a combination of the three-dimensional room model and three-dimensional ray-polygon intersection tests between the ray and the room model, the simulation process may apply an additive absorption, according to the types of surface materials involved in any ray-polygon collisions. Further intersection tests may be performed to determine whether the ray has intersected with a sound detector in the room (block 414).

If the current ray does intersect with a detector (i.e., 'Y' at block 414), the process may proceed to count the ray's energy at block 416. The accumulated ray energy detected at the detector may be stored in a multi-dimensional histogram that sorts in coming ray by time, energy level, frequency, etc., as described above. If, instead, the current ray does not intersect with a detector (i.e., 'N' at block 414), the process may proceed to determine whether the current ray has intersected with a room surface in the room that it has been launched (block 418).

If the current ray does intersect with a room surface (i.e., 'Y' at block 418), the process may proceed to calculate the material absorption amount of the surface that the ray intersected with at block 420. Once the absorption amount is determined, the amount of energy in the ray may be decremented by the appropriate amount (e.g., the amount that was estimated to be absorbed by the intersected surface and the amount that may have already been covered by another method, such as IS) and the process may proceed to block 422 to determine if the ray's remaining energy is above the simulation's set energy threshold. The energy threshold may comprise the amount of energy, below which, the flight of a ray no longer needs to continue to be simulated, as it would have a negligible effect upon the sound in the room. The energy threshold may also define the dynamic range of the decay. If the remaining energy in the ray is no longer above the simulation's energy threshold (i.e., 'N' at block 422), the process may return to block 408 to continue simulating the launch of the remaining rays in the processing thread. If, instead, the remaining energy in the ray (e.g., after absorption by whatever material surface it has intersected with) is still above the simulation's energy threshold (i.e., 'Y' at block 422), the process may proceed to block 424 to launch any indirect, e.g., secondary, rays (e.g., scattered rays) that are estimated to occur based off the ray's intersection with the material surface.

Next, the process may determine whether the sound detector is occluded in some way (e.g., blocked from being able to receive incoming sound rays by some other plane or surface in the room model between the detector and the path of an incoming ray). If the detector is not occluded (i.e., 'N' at block 426), the process may proceed to block 430, wherein the energy of the indirect secondary rays is tabulated, e.g., by being added to the simulator's energy histogram. Next, the simulator may proceed to block 428 to determine whether the time since the initial launch of the ray is still less than the simulation's set time threshold. The threshold may be set by a user, and may comprise the amount of time, beyond which, the flight of a ray no longer needs to continue to be simulated, as per the user, it would have a negligible effect upon the sound in the room. If the detector was occluded, (i.e., 'Y' at block 426), the process may proceed directly to block 428 to perform the time threshold check. If, at block 428, it is determined that the simulation's time threshold has been exceeded (i.e., 'N' at block 428), the process may return to block 408 to continue simulating the launch of the remaining rays in the processing thread. If, instead, at block 428, it is determined that the simulation's time threshold has not been exceeded (i.e., 'Y' at block 428), the process may proceed to block 412 to recursively simulate the re-launching of the reflected ray, e.g., using its updated energy, time, frequency, and directional properties.

Returning back to the decision block at block 418, if the current ray has not intersected with a room surface yet (i.e., 'N' at block 418), the process may proceed to determine whether the current ray has traveled through a portal in the room (e.g., an open door or window) and into another room or outdoor space (block 432). If the ray has not traveled through a portal (i.e., 'N' at block 432), the process may return to block 408 to continue simulating the launch of the remaining rays in the processing thread. If, instead, the ray has traveled through some form of portal in the room model (i.e., 'Y' at block 432), the process may proceed to block 434 to cause the ray to travel into the next room or portion of the room model that it has entered into by passing through the portal, apply any necessary filters to the ray necessitated by passing through the portal, and/or calculate any new direction trajectory for the ray necessitated by passing through the portal. Upon determining the new ray characteristics caused by passage through the portal, the process may return to block 412 to recursively simulate the re-launching of the ray, e.g., using its updated energy, time, frequency, and directional properties from passage through the portal.

The method 400 described above may continue for each processing thread until all rays in the thread have been simulated to conclusion, e.g., by exceeding the simulation time threshold, for going below the simulation's energy threshold, by reaching an acoustic dead zone in the room model, and/or by exiting the room model altogether (e.g., by exiting through an open door, open window, or through an opening in the roof, ceiling, etc.). As stated above, a similar simulation process may be taking place simultaneously, e.g., in parallel, on different processing cores, which may be simulating the launching of different groups of coherent rays on different processing cores. Once each of the processing threads has concluded its simulations, the method 400 may be considered complete for that round of ray tracing simulations. Of course, subsequent ray tracing simulations may be done, e.g., using a different of source rays, launching the rays from a different place in the room model, receiving the rays at a different place in the room model, etc. Further optimizations to the ray tracing simulation process may be obtained by using the reciprocity principle, e.g., launching the rays form both the sound source and the sound receiver, and then simply adding the directional energy histograms on the receiver side, and/or by the use of spatial data structures to accelerate intersection tests.

In this way, as described above, the ray tracing process 400 may take into consideration the actual acoustical characteristics of the room, e.g., the reflection off a wall is different for an acoustical reflection that it is for an optical reflection. Further, sound rays are scattered or absorbed in a certain way, based on the type of material, the angle of incidence, the amount of energy in the sound wave, etc. This type of ray tracing simulation also provides rich, multi-dimensional information, e.g., a simulation result in the time, frequency, and spatial domains, which will be discussed further below, with regard to the impulse response synthesis process.

As mentioned above, the real-time room acoustical simulation of a dynamic virtual environment that contains various rooms and sound sources will typically exceed the computational power of a single CPU core. Thus, a parallel computation of single simulation processes may preferably be carried out in order to meet real-time constraints for complex room situations. Concepts for parallel computing are typically divided in two main categories according to their underlying memory architecture, e.g., either shared or distributed memory. Thus, the intelligent usage of a multiple core CPU may further enhance a solution's ability to meet the real-time constraints for complex room auralization.

According to some embodiments, physiological knowledge of the human ear may also be applied to find the best tuning parameters for the simulation. For example, it is known that the reflection patterns are different for audio rays of different frequencies. So, by analyzing how well the ear can distinguish different frequencies in the reverberation, a determination may be made as to how well the human ear can distinguish between, e.g., different low, mid, or high frequencies, bouncing off a particular surface (at a particular time) in the room, thus informing whether such reflections are perceptually important to simulate for the user.

Tuning the ray tracing simulation may also be seen as a balance between resolution and processing speed. For example, if, in some embodiments, a detector wants or needs to find the exact direction of a reflection down to an exact degree, it will take longer than if the directional estimate is permitted to be within, e.g., +/−10 degrees or +/−20 degrees of the actual reflection because it requires that more energy particles be simulated. As the resolution tolerance lessens, the ray tracer may get faster, but, at some point, the synthesized reverberations may not sound realistic to the listener.

If a high degree of accuracy is desired, e.g., in regard to the direction of incoming reflection, it may require a greater amount of time to process the information, e.g., due to the finer spatial quantization. One way of dealing with this greater processing cost is using a parallelization scheme. For example, a detection sphere in a given ray tracing simulation may simply be copied to each CPU core, such that each detection sphere acts independently of the others—thereby solving many data collision problems typically associated with multiple rays arriving at the same detector at the same time. Then, at the conclusion of the simulation, all the detection spheres may be combined together again, e.g., by superimposing the directional energy histograms of each detection sphere. If the resolution is very high, bringing the data together in a non-redundant fashion may take more time for the synchronization to happen than is desirable under real time constraints. Thus, the resolutions for each detection sphere may be tuned to strike the desired balance for a given implementation between resolution/accuracy and speed. One technique that may be used to bring together the energy contributions from the various threads in an efficient fashion during the superimposition process is referred to in the art as a "reduction" process.

Figure 5:
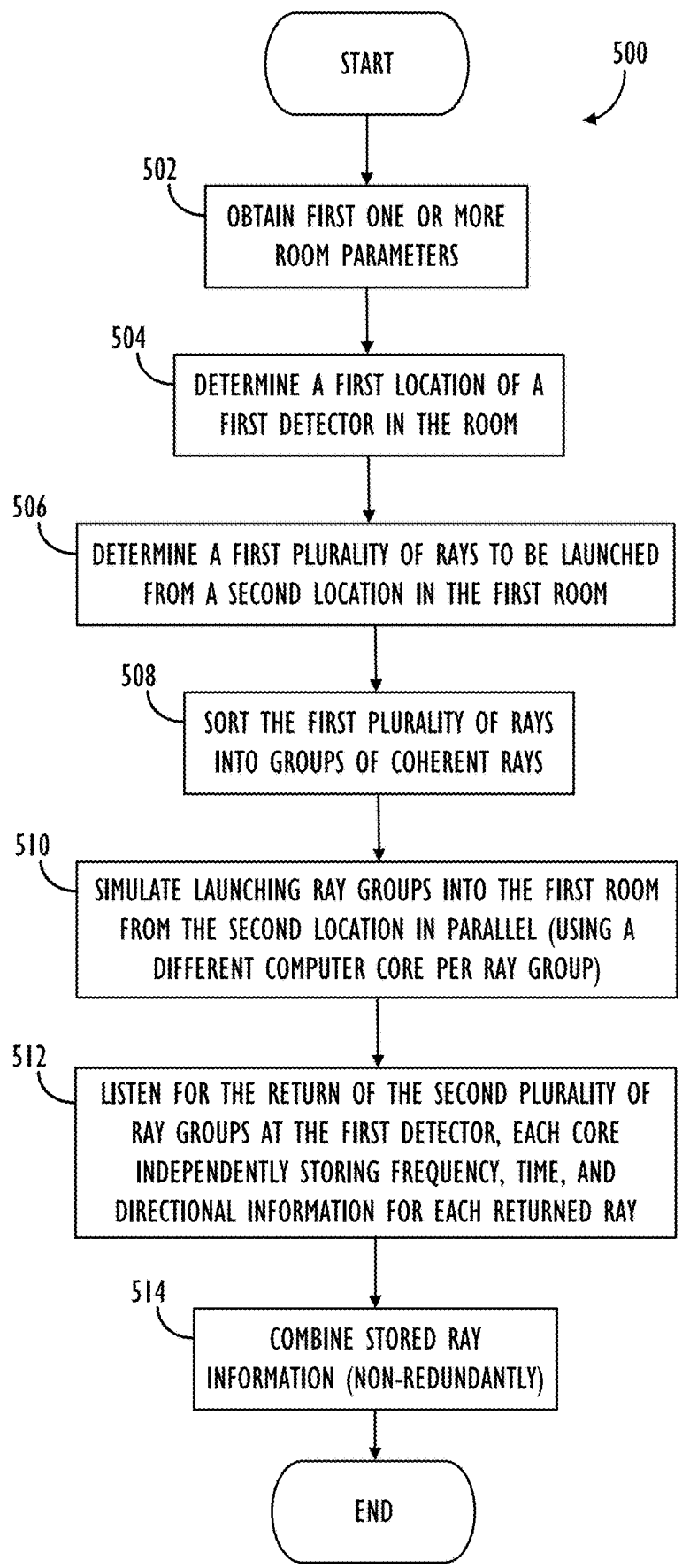
FIG. 5 is a flowchart illustrating another method of performing a ray tracing algorithm, according to one or more embodiments.

Turning now to FIG. 5, a flowchart 500 illustrating one method of an improved ray tracing algorithm is shown, according to one or more embodiments. As will be appreciated, FIG. 5 describes the ray tracing simulation process at a higher level of abstraction than the process described in FIG. 4, for illustrative purposes. First, at block 502, the process begins obtaining one or more room parameters. This may include the aforementioned room model, polygon listings, surface materials, etc. for the room. Next, at block 504, the process determines a first location of a first detector in the room. This may be thought of, e.g., as the location of the listener in the room. Next, the process may determine a first plurality of rays to be launched from a second location in the first room (block 506). Next, the process may pre-sort the first plurality of rays into groups of second rays, e.g., before the rays are launched from the second location (block 508). Next, the process may simulate launching the ray groups into the first room from the second location in parallel, e.g., using a different CPU core for each ray group (block 510). Next, the process may "listen" with the first detector for the return of the second plurality of ray groups that were launched (block 512). According to some embodiments, each detector at each core may independently store the frequency, time, and directional information associated with each respective returned ray detected at the detector. Finally, the stored information across the various cores and virtual detectors may be combined (in a non-redundant fashion) to generate a final ray tracing result (block 514), whereupon the process may end.

Figure 6:
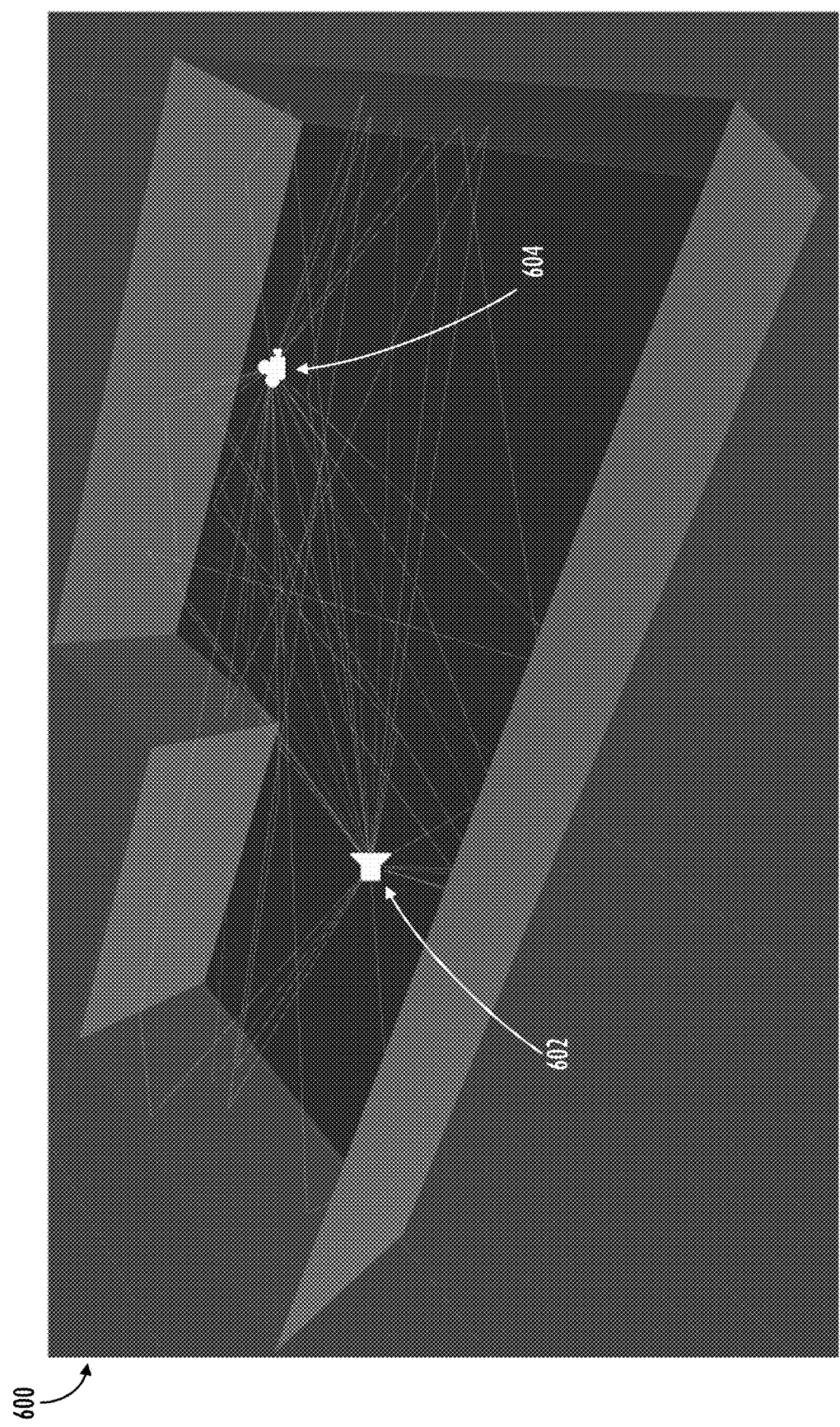
FIG. 6 is an exemplary visualization of room acoustics for a virtual 3D environment, according to one or more embodiments.

Turning now to FIG. 6, an exemplary visualization 600 of room acoustics for a virtual 3D environment is shown, according to one or more embodiments. The various ray paths represent the reflection paths from a source (e.g., at location 602 in the room) that have been received at a detector (e.g., at location 604 in the room).

Figure 7:
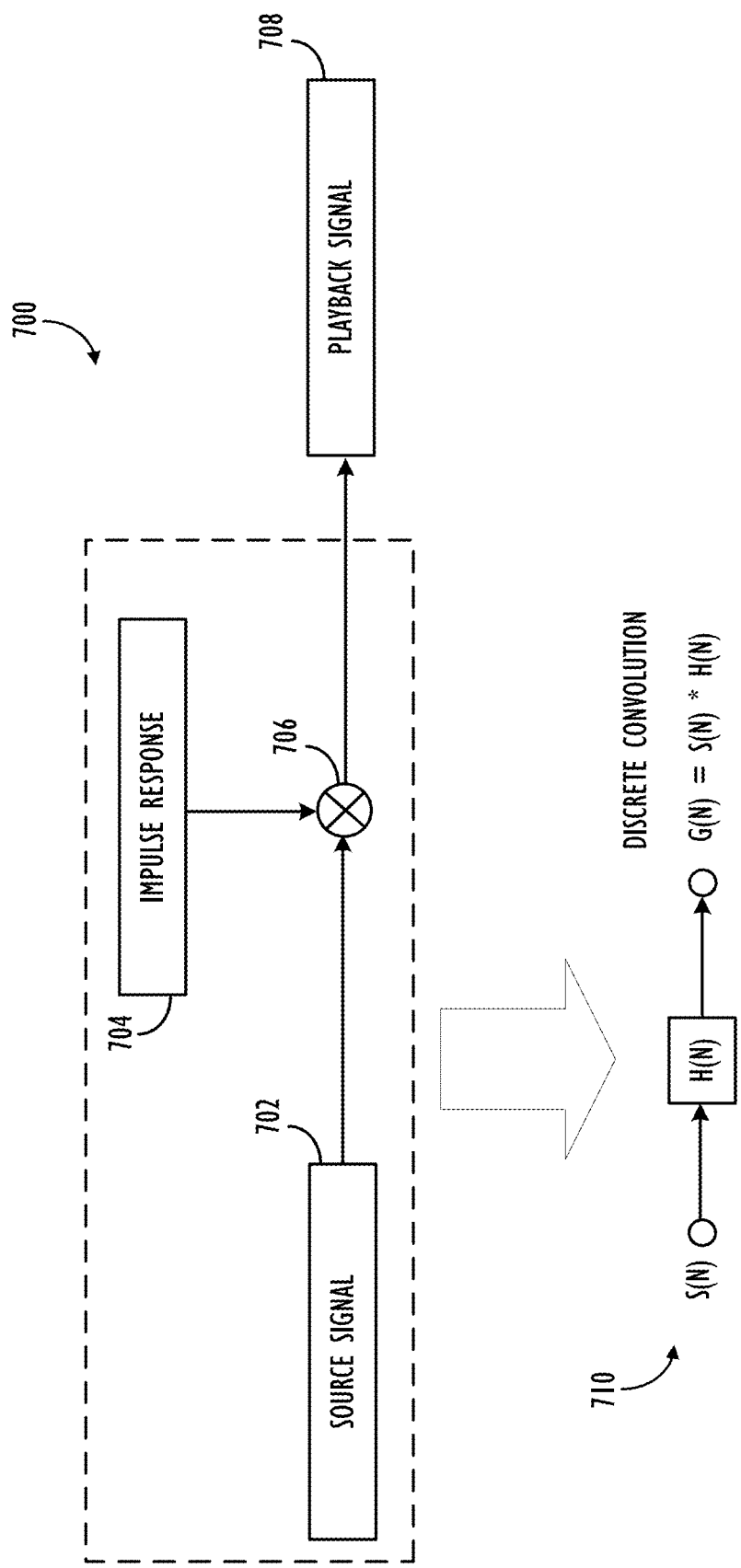
FIG. 7 is a block diagram showing an exemplary discrete convolution operation for generating a playback audio signal, according to one or more embodiments.

Synthesis of Spatial Impulse Responses Form Spatial-Time-Frequency Energy Probability Density Functions As mentioned above, Spatial Impulse Response (SIR) functions may be used to auralize an input audio signal, such that it appropriately simulates the acoustic properties of the room that the input audio signal is being produced in. Turning now to FIG. 7, a block diagram 700 showing an exemplary discrete convolution operation for generating a playback audio signal is shown, according to one or more embodiments. Almost any medium, whether it is solid, liquid, or gaseous, can transmit vibrations and thus sound waves. In most cases, a sound transmitting system of coupled media can be assumed to be linear and time-invariant, or, in other words, it is assumed that the system is at rest during the time of inspection. By definition, the propagation of a signal through such a Linear Time-Invariant (LTI)-system is unambiguously describable by the corresponding impulse response. Thus, an LTI-system with known impulse response h(t) (704) and input signal s(t) (702) will yield an output signal g(t) (708), as:

$$g(t) = \int_{-\infty}^{\infty} s(\tau)h(t-\tau)d\tau = s(t) * h(t), \qquad \text{(Eqn. 1)}$$

or, in the frequency domain, as:

$$G(f)=S(f)\cdot H(f) \quad \text{(Eqn. 2)(710)},$$

where H(f) is called the room transfer function.

In most auralization embodiments, the description in the frequency domain is usually preferred, since it avoids the more complex convolution operator (706). Upon now considering a room with a sound source and a listener, as such a system in the frequency domain, then S(f) relates to the frequency function of the dry source signal s(t); H(f) describes the Room Transfer Function (RTF), and G(f) refers to the modified source signal at the listener's eardrums. In this interpretation, the RTF can be seen as the sum of transfer functions from LTI-subsystems, e.g., single sound reflections.

By convolving the source signal with the SIRs, the response of the room is added to the source signal. If the SIRs are exact, the output signal g(t) will sound nearly identical to the real event, including the spatial perception.

Figure 8:
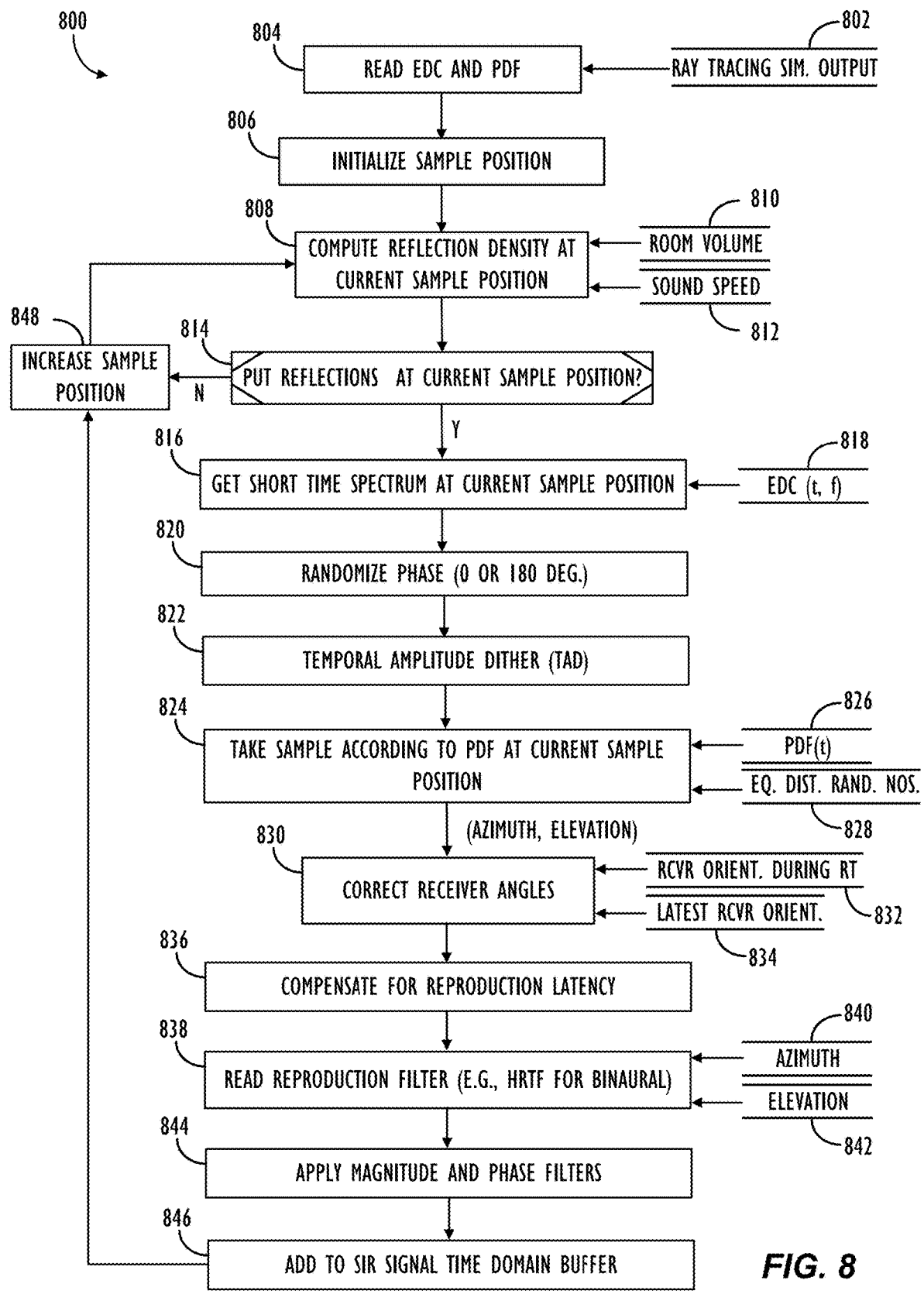
FIG. 8 is a flowchart illustrating one method of performing an improved Spatial Impulse Response (SIR) generation algorithm, according to one or more embodiments.

Turning now to FIG. 8, a flowchart 800 illustrating one method of performing an improved Spatial Impulse Response (SIR) generation algorithm is shown, according to one or more embodiments. First, the input to method 800 may comprise the results of the ray tracing simulation, e.g., as described above with respect to FIGS. 4 and 5. Thus, at block 802, the method 800 may read in the Energy Decay Curve (EDC) (i.e., a function describing how the energy in the acoustic simulation decays over time, as a function of frequency) and Probability Density Function (PDF) from the ray tracing simulation, which characterize the acoustic properties of the room at the location of the sound receiver.

Next, the method 800 may initialize the SIR simulation to a starting point (e.g., choose an initial sample position) at block 806. Based on the sample's current position in the impulse response, the method may then compute a reflection density for the sample, e.g., based on the room model's volume (810) and the speed of sound in the room (812). Next, the method may determine, using a random process, according to the reflection density, whether to put a reflection at the current sample's position (block 814). If there is no reflection at the current sample position (i.e., 'N' at block 814), the method may simply increase the sample position to the next position that is to be tested (block 848) and then return to block 808 to compute the reflection density at the newly-updated sample position.

If, instead, there is a reflection at the current sample position (i.e., 'Y' at block 814), the method may proceed to block 816 to get the short time spectrum information for the current sample position. This information may be pulled from the EDC (818), which provides both a time- and frequency-based energy estimates. Next, the method may randomize the phase of the energy distribution, e.g., by using 0 degrees or 180 degrees (block 820). Next, a Temporal Amplitude Dithering (TAD) filter may be applied to the energy distribution in order to smooth out temporal artifacts in the EDC by breaking up any periodic patterns that may exist in the quantized EDC (block 822). Human hearing is very sensitive to temporally periodic patterns. However, using temporal quantization in the simulation may result in such periodic patterns in the output. Thus, TAD may be used to mask such periodic patterns. Applying TAD may comprise adding evenly-distributed noise to the amplitude of the reflections, while maintaining the correct energy level within a local time window.

Next, at block 824, a sample may be taken from the PDF (826) obtained from the RT simulation. According to some embodiments, an evenly-distributed random number generator (828) may be used for sampling the PDF at random positions. The method may re-sample as many reflections as are needed or wanted for a given implementation. The return information may include the azimuth and elevation of the sample, and will be continuous (e.g., not quantized). The sum of all reflections will follow any temporal, spectral, and/or spatial distributions added at the beginning of the method. At block 830, corrections may also be made to account for any changes in the receiver's orientation from its orientation during the ray tracing process (832), as well as the latest known receiver orientation within the room model (834).

Once any changes in the orientation of the receiver have been accounted for, the method may attempt to compensate for reproduction latency (block 836). Next, at block 838, the method may read the reproduction filter (using the aforementioned azimuth 840 and elevation 842 information for the current sample). For example, according to some embodiments, a pair of Head Related Transfer Functions (HRTFs) may be used for the reproduction of binaural audio signals. Finally, the method apply any magnitude and phase filters (block 844) and add the reproduced signal to the SIR signal's time domain buffer (block 846), before returning to block 848 to increase the sample position to the next position that is to be tested and then return to block 808 to compute the reflection density at the newly-updated sample position. The process 800 may then be repeated until the PDF has been sufficiently re-sampled, such that a perceptually accurate SIR has been generated. The amount of re-sampling needed for a given implementation may be a tradeoff between computational performance and time constraints.

Figure 9:
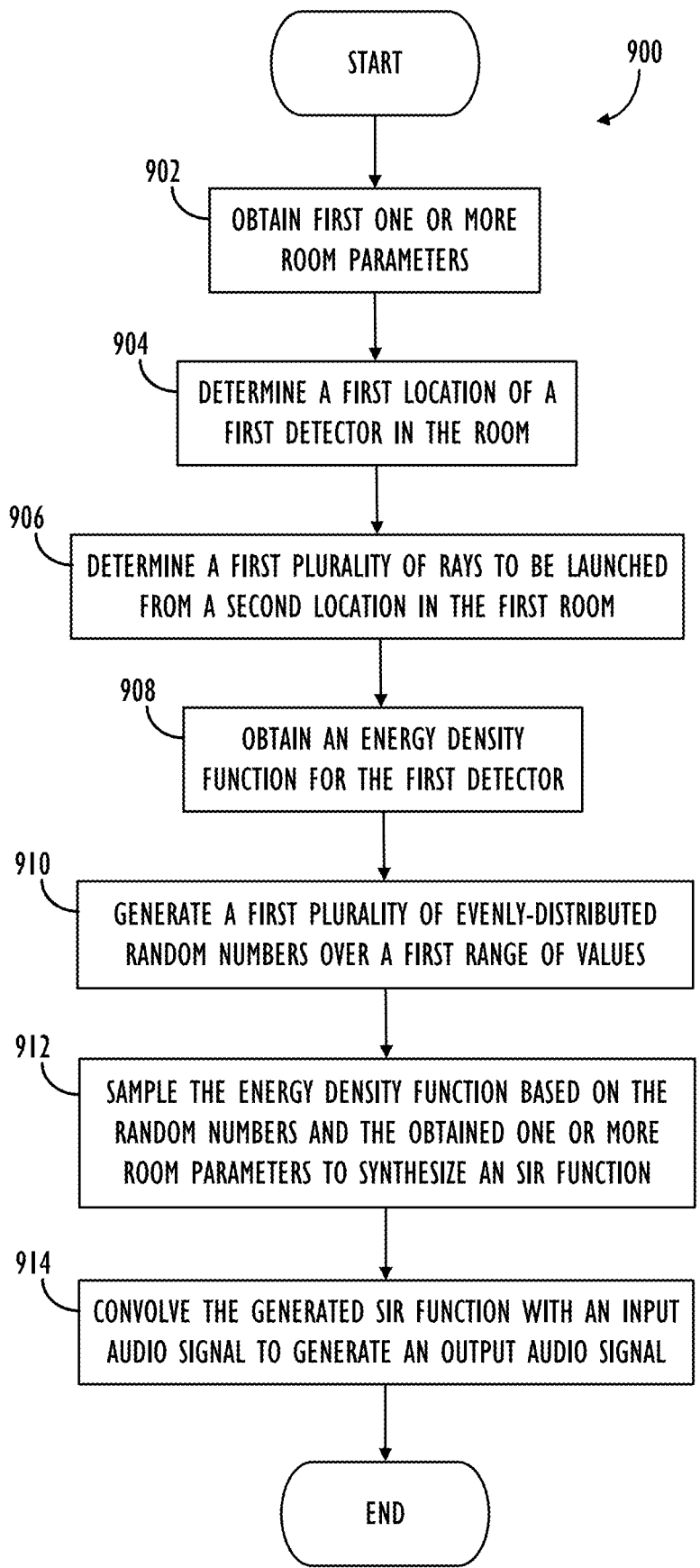
FIG. 9 is a flowchart illustrating another method of performing an improved SIR generation algorithm, according to one or more embodiments.

Turning now to FIG. 9, a flowchart 900 illustrating one method of an improved spatial impulse response generation algorithm is shown, according to one or more embodiments. As will be appreciated, FIG. 9 describes the SIR generation process at a higher level of abstraction than the process described in FIG. 8, for illustrative purposes. First, at block 902, the process begins obtaining one or more room parameters. This may include the aforementioned room model, polygon listings, surface materials, etc. for the room. Next, at block 904, the process determines a first location of a first detector in the room. This may be thought of, e.g., as the location of the listener in the room. Next, the process may determine a first plurality of rays to be launched from a second location in the first room (block 906). Next, the process may obtain an energy probability density function (PDF) for the first detector (block 908). As mentioned above, this energy probability density function may comprise a spatial-time-frequency probability density function that more accurately accounts for the laws of physics than prior art implementations.

Next, the process may generate a first plurality of evenly-distributed random numbers over a first range of values, e.g., [0 . . . 1] (block 910). These random numbers may then be used to randomly re-sample the PDF from block 908, wherein the re-sampling process is based on the random numbers and the obtained one or more room parameters. In particular, acoustic principles state that the number of reflections in a room grows exponentially over time, so more and more reflections need to be simulated over longer periods of time. Each reflection is sampled from the PDF, applying the a priori knowledge about the room (e.g., from the one or more room parameters), such as the number of reflections to expect, together with knowledge of how to remap the randomly-generated numbers to the PDF.

For example, while iterating through the resampling process of the PDF, the process may query the impulse response function at a particular sample time, e.g., asking, "Are we expecting a reflection here, yes or no?" If the answer for that sample is, "Yes, we expect reflection," then the underlying energy probability density may return back a five-dimensional expectation for the sample: 1.) frequency (e.g., frequency band); 2.) energy magnitude; 3.-4.) 2D-directional (e.g., angular) information; and 5.) time/distance. Although the angular quantization is discrete, the resampling method returns continuous angles, e.g., unlimited spatial resolution. This process is then repeated many times until the probability density has been sufficiently re-sampled.

Once a desired number of samples have been taken with the correct properties and distribution in space/time/frequency, a spatial impulse response (SIR) function may be synthesized (block 912). The generated SIR should then have the correct energy distribution (e.g., over time, frequency, and direction) from the ray tracing. It should also obey the physical laws of the distribution of reflections over time (e.g., with the number of reflections exponentially increasing over time).

Finally, the generated SIR may be convolved with an input audio signal to generate a perceptually-accurate output signal which may be reproduced, e.g., by a loudspeaker or in binaural form for reproduction over headphones (block 914), at which point the process may end when there is no additional input audio information to transform.

Such synthesized impulse responses may also be applied in Augmented Reality (AR)/Mixed Reality (MR) scenarios, wherein additional sound information (e.g., in the form of the synthesized impulse responses) is added to the sounds in a listener's actual real-world environment to accurately simulate the presence of a "virtual" sound source that is not actually present in the listener's real-world environment. For example, the virtual sound may comprise a human voice (either the listener himself or herself, or another "virtual" person in the virtual room environment), a musical instrument, footsteps, etc. Using the techniques described herein, a single-channel audio signal, e.g., representative of an instrument or the voice of a "virtual" person not actually physically co-located in the same room as the listener, may be convolved with the determined spatial impulse response function(s). In case of binaural reproduction via headphones, the output of such convolution will be a two channel audio signal (e.g., one channel for each ear), that accurately reproduces the input sound, while taking account of the physical acoustic properties of the room (or virtual room) that the listener is currently located in (e.g., as gleaned from the aforementioned ray tracing process).

Figure 10:
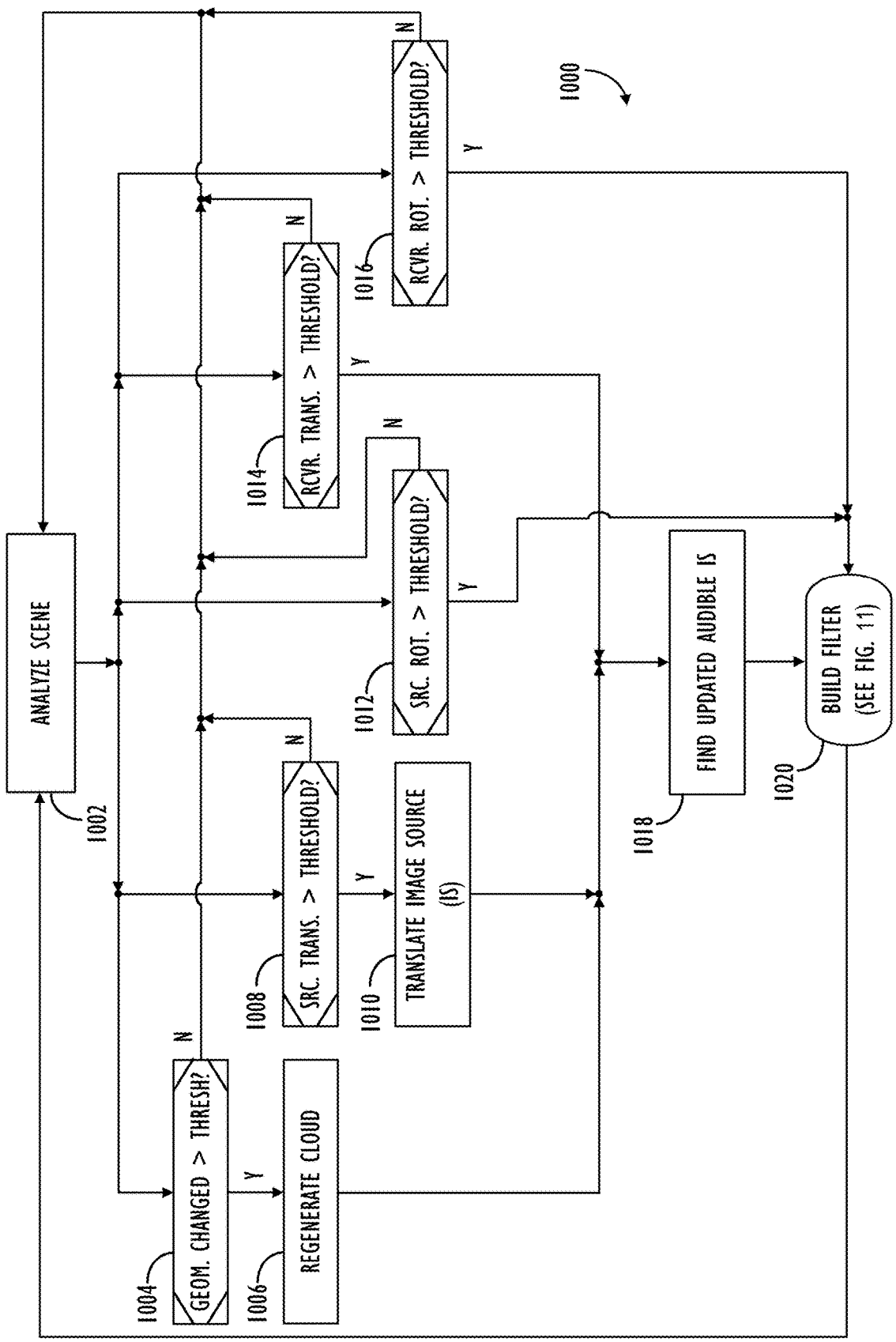
FIG. 10 is a flowchart illustrating one method of performing an improved Image Source (IS) simulation algorithm, according to one or more embodiments.

Turning now to FIG. 10, a flowchart 1000 illustrating one method of performing an improved Image Source (IS) simulation algorithm is shown, according to one or more embodiments. According to some embodiments, before starting the simulation of the room environment, all of the ISs of the primary and secondary sound sources in the room may be preprocessed (e.g., up to a specific reflection order) and then stored in data structures that are associated with the respective sound sources or edges. Since ISs are related to the room's geometry, the overall "cloud" of ISs does not need to be changed—as long as the respective sound sources are not moved and no geometrical modifications are made to the room model.

Thus, the method 1000 may begin at block 1002 by analyzing the scene, e.g., the room environment in which the simulation will be taking place. For example, the method may need to determine a baseline characterization of the scene, such that subsequent variations to the scene may be detected. A scene analyzer may determine, among other things: whether the scene geometry has changed (e.g., whether one or more polygons in the room model were added/removed/translated/rotated); whether the sound source has moved above a user-defined threshold amount (e.g., using one threshold for translation and one threshold for rotation); whether the receiver has moved above a user-defined threshold (again, potentially using one threshold for translation and one threshold for rotation); and/or whether any other geometry-relevant actions or events have taken place in the scene. As will be described, perturbations to any of these variables may necessitate the re-computation of the image sources for the scene.

For example, if the scene geometry has changed above a threshold amount (i.e., 'Y' at block 1004), e.g., by a new surface being added to the room model or an existing surface being removed from the room model, the method may partially or fully regenerate a new IS "cloud" for the room (block 1006) and then proceed to block 1018 to find the new audible image source for the room model. According to some embodiments, regenerating the IS cloud for the room model may comprise computing and updating the current audible IS for the observed source/receiver combination. If, instead, the scene geometry has not changed (i.e., 'N' at block 1004), the method may simply return to block 1002 to continue to analyze the scene.

If, upon analysis of the scene at block 1002, it is determined that the sound source itself has translated above a threshold amount (i.e., 'Y' at block 1008), the method may proceed to block 1010 to translate the image source by the indicated translation amount and direction and then proceed to block 1018 to find the updated audible image source for the room model. According to some embodiments, translating the image source by the indicated translation amount and direction at block 1016 may comprise translating all ISs by the indicate amount on all unique planes of the room model with respect the new source position. Moreover, if the sound source was translated beyond a threshold amount, the respective IS cloud may also be translated, e.g., to take into account the new source position and its impact on the IS positions. Then, at a subsequent step in the method, another "Find updated audible IS" test (block 1018) may be triggered, which will compute and update the current audible IS for the new observed source/receiver combination. If, instead, the source has not translated more than the threshold amount (i.e., 'N' at block 1008), the method may simply return to block 1002 to continue to analyze the scene.

If, upon analysis of the scene at block 1002, it is determined that the sound receiver has translated above a threshold amount (i.e., 'Y' at block 1014), the method may proceed to block 1018 to find the updated audible image source for the room model, e.g., based on whatever changes to the scene geometry or source that may have taken place within the room model. If, instead, the receiver has not translated more than the threshold amount (i.e., 'N' at block 1014), the method may simply return to block 1002 to continue to analyze the scene.

In case of rotation, e.g., either source rotation above a threshold amount (i.e., 'Y' at block 1012) or receiver rotation above a threshold amount (i.e., 'Y' at block 1016), or both, the IS cloud and the audible image sources may each remain the same, with the method thus proceeding to block 1020 to build a new SIR filter for the IS, as is described in further detail, with respect to FIG. 11 below. If, instead, the source has not rotated more than the threshold amount (i.e., 'N' at block 1012) or the receiver has not rotated more than the threshold amount (i.e., 'N' at block 1016), the method may simply return to block 1002 to continue to analyze the scene.

According to some embodiments, finding the new audible IS at block 1018 may comprise backtracing (e.g., tracing back to the source of the IS, resulting in an intersection) the simulated rays and testing for any new detector or source occlusions caused by the change(s) in the scene. Once the updated audible IS(s) is determined at block 1018, the method may proceed to block 1020 to construct a new SIR filter for the IS, as is described in further detail, with respect to FIG. 11 below, while also continuing to analyze the scene (block 1002) for the next scene change(s) that may necessitate the construction of another new SIR filter.

Figure 11:
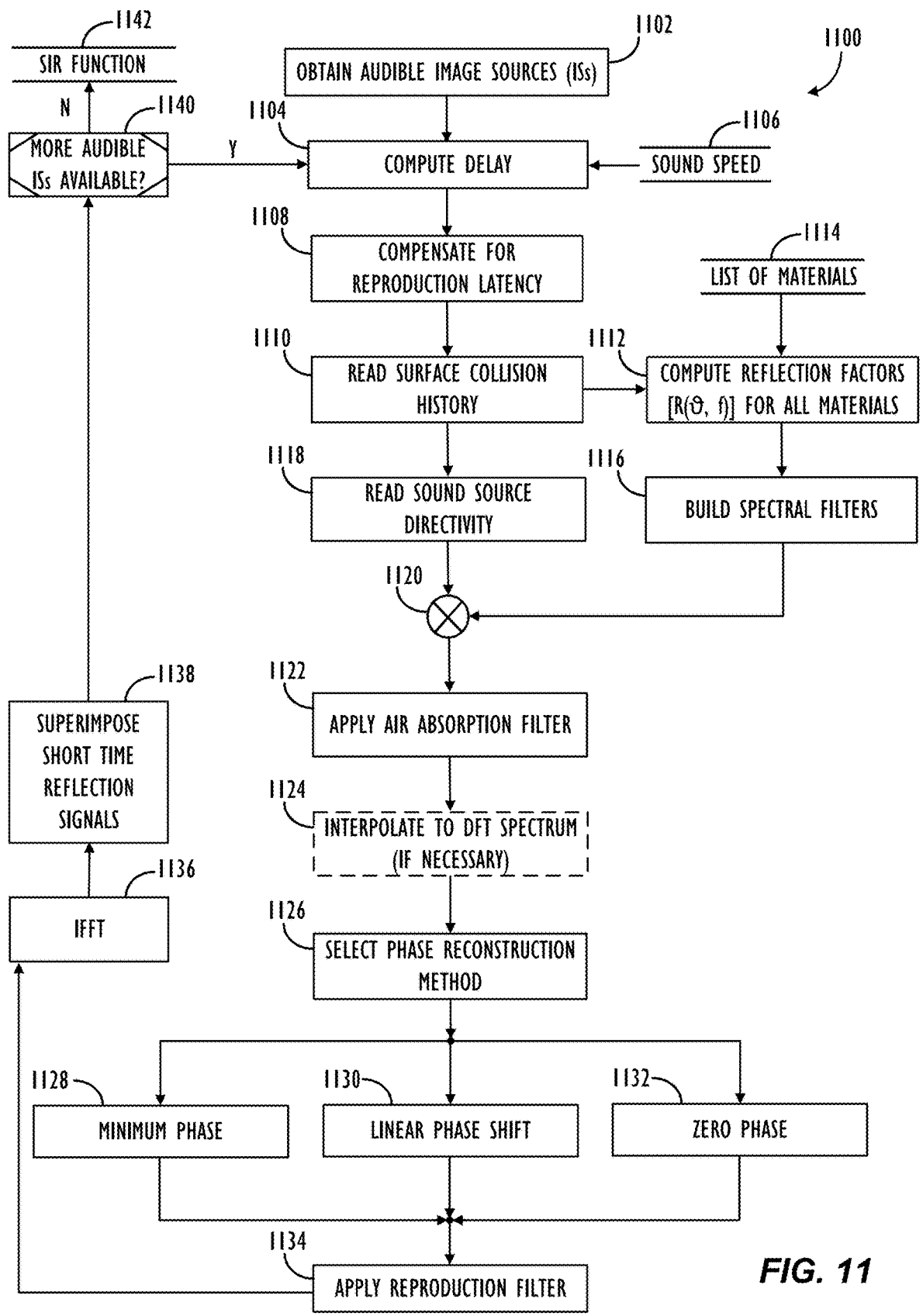
FIG. 11 is a flowchart illustrating one method of generating a SIR function for an IS simulation, according to one or more embodiments.

Turning now to FIG. 11, a flowchart 1100 illustrating one method of generating a SIR function for an IS simulation is shown, according to one or more embodiments. First, the method may begin by obtaining the audible Image Sources for which the SIR function is to be generated, e.g., the output from the method illustrated in FIG. 10 (block 1102). Next, at block 1104, the method may compute the delay time for the propagation of sound waves in the environment, which may be based on, among other things, the speed of sound (1106) in the environment. Next, the method may compensate for any reproduction latency associated with the simulation (block 1108). The method may also then read the surface collision history for the current Image Source being analyzed (block 1110). Using a knowledge of the historical surface collisions in the environment, as well as a listing of materials (1114) for the surfaces making up the environment, the reflection factors [R(ϑ, f)] may be computed for each of the materials in the environment (block 1112). According to some embodiments, the reflection factors may be a function of both the sound waves' velocity and frequency (as well knowledge of the type of material that the sound wave is reflecting off of). According to some embodiments, the reflection factors may be a function of reflection angle ϑ. Once the reflection factors are all known, spectral filters may be built (block 1116). According to some embodiments, the spectral filters may comprise, e.g., octave filters, one-third octave filters, or complex full spectrum data. Next, the method may read the sound source directivity information from the IS (block 1118) and modify them by taking the product (1120) of the sound source directivity information with the computed reflection factors for the various environmental materials. This result may then be combined with the air absorption filters (block 1122), to result in audible image source information that has accounted for: reproduction latency; surface collisions and reflections; the direction of the sound sources; the speed of sound in the environment; and air absorption properties. This data may then be interpolated, in order to convert from an frequency-based resolution to the Discrete Fourier Transform (DFT)-spectrum (block 1124). Next, one of several phase reconstruction methods may be selected (block 1126). For example, a minimum phase reconstruction method (1128), a linear phase shift reconstruction method (1130), or a zero phase reconstruction method (1132). Next, the reproduction filter may be applied to the signal (block 1134). For example, according to some embodiments, the reproduction filter may comprise one or more HRTFs. Next, an inverse Fast Fourier Transform (IFFT) may be applied to the signal to bring it back into the time domain (block 1136). Finally, the short time reflection signals computed earlier may be superimposed in the final impulse response signal (block 1138). If there is another audible Image Source to process (i.e., 'Y' at block 1140), the method may proceed to block 1104 to process the next IS. If, instead, there are no further audible Image Sources to process (i.e., 'N' at block 1140), the method may proceed to block 1142 to return the resulting Spatial Impulse Response (SIR) function, at which point the method 1100 may terminate.

Figure 12:
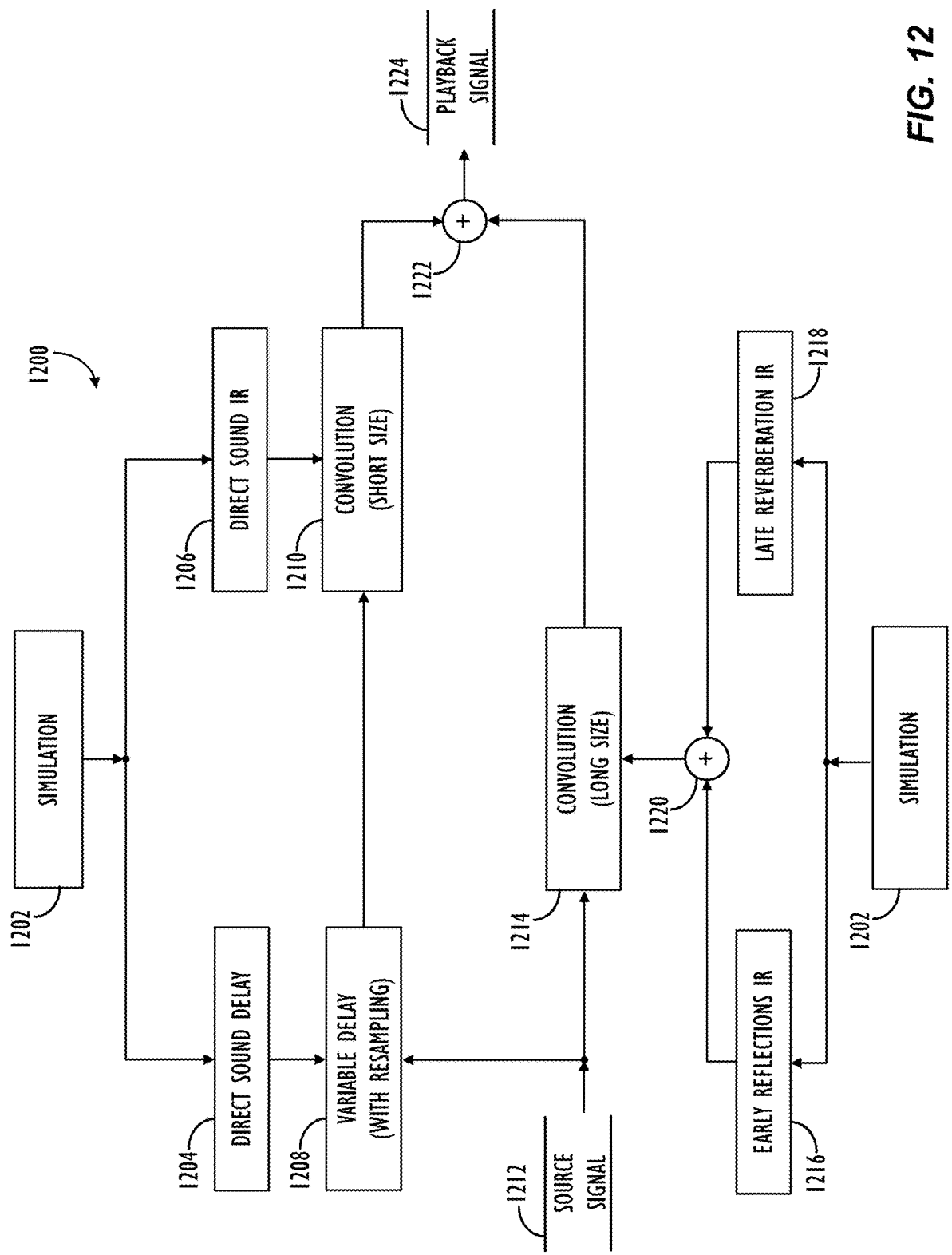
FIG. 12 is a flowchart illustrating one method of generating an auralized audio output signal, according to one or more embodiments.

Impulse responses may comprise direct sound, early reflections, and late reflections. Each acoustic component of the IR may be exchanged separately, e.g., without audible artifacts, e.g., by applying a temporal crossfade function to the various components of the signal. Turning now to FIG. 12, a flowchart is shown, illustrating one method 1200 of generating an auralized audio output signal, according to one or more embodiments. As illustrated, the different parts of the IR may be processed using separate convolution cores. First, a ray tracing simulation result (1202) may provide both direct sound delay information (1204) and direct sound IR information (1206) so that the direct sound component of the impulse response may be exchanged. Next, the source signal (1212) may be convolved with the direct sound signal using a variable delay with resampling, if so desired (1208). The output of the variable delay sampling may then be convolved (1210) with the direct sound IR function, e.g., using a short size filter.

Simultaneously, the early reflections IR function (1216) and the late reverberation IR (1218) from the simulation results (1202) may be combined (1220) and convolved with the source signal (1212), e.g., using a long size filter (1214). The results of the convolutions at block 1210 and block 1214 may then be combined (1222) to generate the playback audio signal (1224).

As may now be appreciated, the method 1200 enables the performance of a 'lock-free' update of the direct sound at interactive rates. In other words, there are no data dependencies between the direct sound, early reflections, and late reflections.

Figure 13:
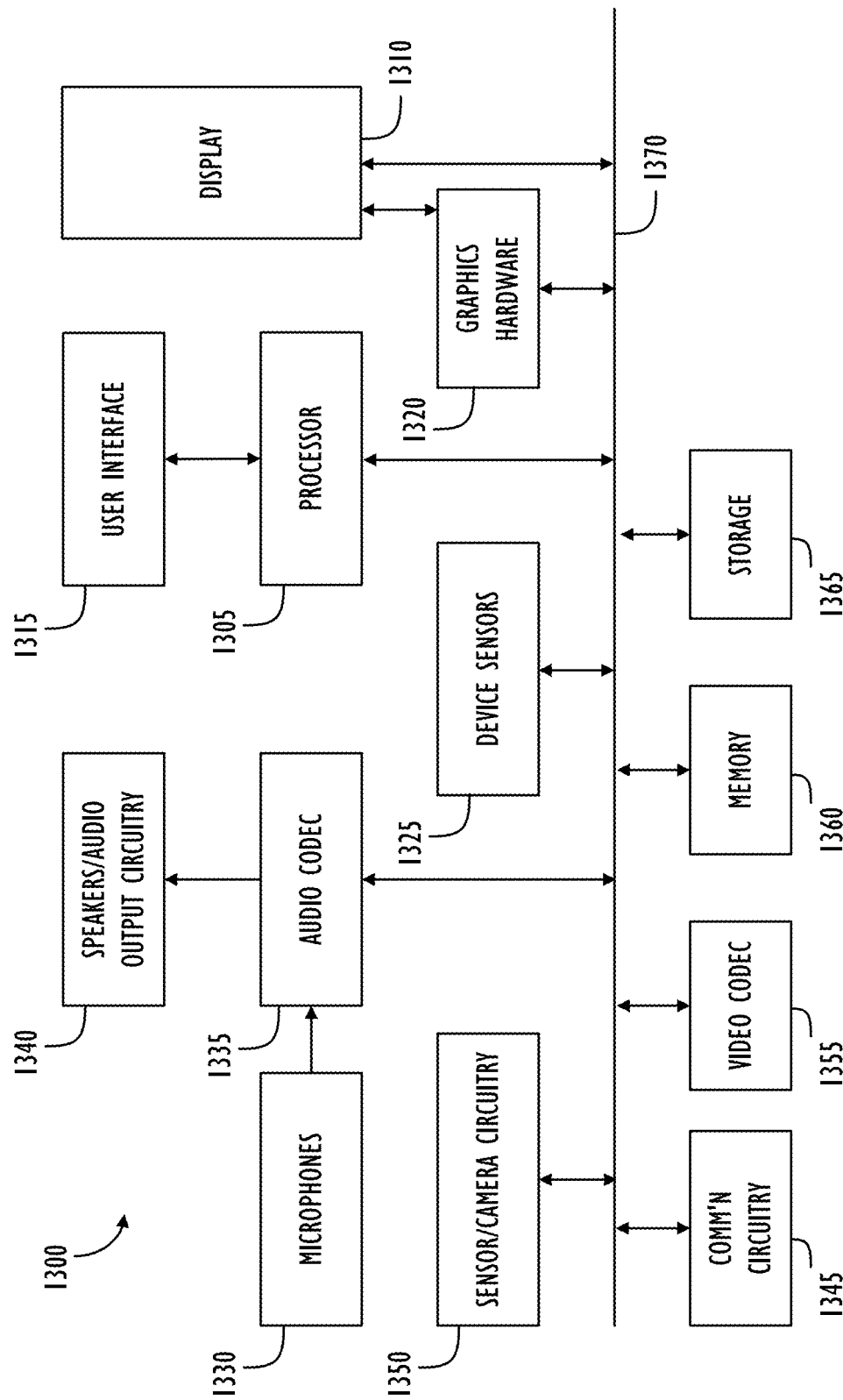
FIG. 13 is a block diagram illustrating an exemplary electronic device in which one or more of the techniques disclosed herein may be implemented or experienced.

Turning now to FIG. 13, a simplified functional block diagram of illustrative electronic device 1300 is shown, according to one or more embodiments. Electronic device 1300 could be, for example, a mobile telephone, personal media device, wearable device, or a tablet, notebook or desktop computer system. As shown, electronic device 1300 may include processor 1305, display 1310, user interface 1315, graphics hardware 1320, device sensors 1325 (e.g., proximity sensor/ambient light sensor, accelerometer and/or gyroscope), microphone(s) 1330, audio codec(s) 1335 (e.g., audio codecs capable of encoding and/or decoding binaural audio signals), speaker(s)/audio output circuitry 1340, communications circuitry 1345, image capture circuit or image sensor unit 1350, which may, e.g., comprise single or multiple camera units/optical sensors having different characteristics, video codec(s) 1355, memory 1360, storage 1365, and communications bus 1370.

Processor 1305 may execute instructions necessary to carry out or control the operation of many functions performed by device 1300 (e.g., such as the generation and/or processing of real-time 3D audio signals in accordance with the various embodiments described herein). Processor 1305 may, for instance, drive display 1310 and receive user input from user interface 1315. User interface 1315 can take a variety of forms, such as a button, keypad, dial, a click wheel, keyboard, display screen and/or a touch screen. User interface 1315 could, for example, be the conduit through which a user may view a virtual room environment and/or indicate particular region(s) that the user would like to have an interaction with (e.g., by clicking on a physical or virtual button on the device's display screen). In one embodiment, display 1310 may display a video stream. In another embodiment, processor 1305 and/or graphics hardware 1320 and/or image capture circuitry may contemporaneously generate and/or display a video stream, which includes or superimposes imagery captured by the image capture circuitry onto a virtual environment. Such video information may also be stored in memory 1360 and/or storage 1365. Processor 1305 may be a system-on-chip such as those found in mobile devices and include one or more dedicated graphics processing units (GPUs) or one or more single- or multi-core computer processing units (CPUs). Processor 1305 may be based on reduced instruction-set computer (RISC) or complex instruction-set computer (CISC) architectures or any other suitable architecture and may include one or more processing cores. Graphics hardware 1320 may be special purpose computational hardware for processing graphics and/or assisting processor 1305 perform computational tasks. In one embodiment, graphics hardware 1320 may include one or more programmable graphics processing units (GPUs).

Image capture circuitry 1350 may comprise one or more camera units configured to capture images, e.g., at different zoom levels or at different resolutions. Output from image capture circuitry 1350 may be processed, at least in part, by video codec(s) 1355 and/or processor 1305 and/or graphics hardware 1320, and/or a dedicated image processing unit incorporated within circuitry 1350. Images so captured may be stored in memory 1360 and/or storage 1365. Memory 1360 may include one or more different types of media used by processor 1305, graphics hardware 1320, and image capture circuitry 1350 to perform device functions. For example, memory 1360 may include memory cache, read-only memory (ROM), and/or random access memory (RAM). Storage 1365 may store media (e.g., audio, image and video files), computer program instructions or software, preference information, device profile information, and any other suitable data. Storage 1365 may include one more non-transitory storage mediums including, for example, magnetic disks (fixed, floppy, and removable) and tape, optical media such as CD-ROMs and digital video disks (DVDs), and semiconductor memory devices such as Electrically Programmable Read-Only Memory (EPROM), and Electrically Erasable Programmable Read-Only Memory (EEPROM). Memory 1360 and storage 1365 may be used to retain computer program instructions or code organized into one or more modules and written in any desired computer programming language. When executed by, for example, processor 1305 such computer program code may implement one or more of the methods described herein.

In some embodiments, the functionality of device 1300 may be split, e.g., between two or more discrete electronic devices. For example, in some embodiments, at least the display (1310) and audio output circuitry (1340) elements may be contained in a wearable device that is placed upon a user's head (e.g., in the form a head-mounted device or visor) and/or over a user's ears (e.g., in the form of headphones) in order to hear the auralized sound and/or see any corresponding visual environment that the auralized sound is being synthesized in. In such embodiments, the wearable device may communicate, e.g., via communication circuitry (1345) with another electronic device, e.g., a desktop, laptop, or other mobile computing device that possesses the sufficient computing core or cores (or is in communication with devices possessing the sufficient computing core or cores) to execute the ray tracing simulation, SIR generation, and/or audio signal synthesis methods described herein. For example, the auralized sound (and/or corresponding video signal) may be transmitted from one electronic device to a wearable device on the user's body via short range communication technologies, e.g., BLUETOOTH®, Near Field Communications (NFC), Infrared (IR), Radio Frequency (RF), etc., as well as wired connections, or other wireless communication technologies (e.g., Wi-Fi) capable of passing information at high throughput bit rates (and with high reliability) from one electronic device to another.

It is to be understood that the above description is intended to be illustrative, and not restrictive. For example, the above-described embodiments may be used in combination with each other. Many other embodiments will be apparent to those of skill in the art upon reviewing the above description. The scope of the invention therefore should be determined with reference to the appended claims, along with the full scope of equivalents to which such claims are entitled.

What is claimed is:

1. A method of performing acoustic ray tracing, comprising:
    obtaining a first one or more room parameters for a first room;
    determining a first location of a first detector in the first room;
    determining a first plurality of rays to be launched from a second location in the first room;
    sorting the first plurality of rays into a second plurality of ray groups, wherein each group of rays in the second plurality comprises a plurality of coherent rays;
    simulating the launch of the second plurality of ray groups into the first room from the second location using at least one computer core; and
    detecting rays from the second plurality of ray groups that return to the first detector.

2. The method of claim 1, wherein the act of simulating comprises determining an amount of scattering for each launched ray.

3. The method of claim 2, wherein the determined amount of scattering for a launched ray is based on a wave frequency of the ray.

4. The method of claim 3, wherein the determined amount of scattering for a launched ray is further based on surfaces in the first room that the launched ray collides with.

5. The method of claim 1, wherein the act of simulating comprises determining an amount of absorption for each surface in the first room that a launched ray collides with.

6. The method of claim 1, further comprising:
    calculating a mean free path for the first room based, at least in part, on the launched rays and a number of surfaces in the first room that the launched rays collided with.

7. The method of claim 6, further comprising:
    estimating a room volume for the first room based on the calculated mean free path for the first room.

8. The method of claim 1, further comprising:
    combining stored information from each of the at least one computer cores in a non-redundant fashion.

9. The method of claim 8, wherein the combined information comprises a probability density function (PDF).

10. The method of claim 9, further comprising:
    generating a spatial impulse response (SIR) function for the first room based, at least in part, on the PDF.

11. The method of claim 10, further comprising:
    generating an audio output signal simulating acoustical properties of the first room based, at least in part, on the SIR function and an input audio signal.

12. A non-transitory program storage device comprising instructions stored thereon to cause one or more programmable control devices to:
   obtain a first one or more room parameters for a first room;
   determine a first location of a first detector in the first room;
   determine a first plurality of rays to be launched from a second location in the first room;
   sort the first plurality of rays into a second plurality of ray groups, wherein each group of rays in the second plurality comprises a plurality of coherent rays;
   simulate the launch of the second plurality of ray groups into the first room from the second location; and
   detect rays from the second plurality of ray groups that return to the first detector.

13. The non-transitory program storage device of claim 12, wherein the instructions to simulate further comprise instructions to determine an amount of scattering for each launched ray.

14. The non-transitory program storage device of claim 12, wherein the instructions to simulate further comprise instructions to determine an amount of absorption for each surface in the first room that a launched ray collides with.

15. The non-transitory program storage device of claim 12, further comprising instructions stored thereon to cause the one or more programmable control devices to:
   calculate a mean free path for the first room based, at least in part, on the launched rays and a number of surfaces in the first room that the launched rays collided with.

16. The non-transitory program storage device of claim 15, further comprising instructions stored thereon to cause the one or more programmable control devices to:
   estimate a room volume for the first room based on the calculated mean free path for the first room.

17. An electronic device, comprising:
   memory;
   audio output circuitry;
   two or more computer cores; and
   one or more programmable control devices coupled to the memory and audio output circuitry, the one or more programmable control devices being configured to:
   obtain a first one or more room parameters for a first room;
   determine a first location of a first detector in the first room;
   determine a first plurality of rays to be launched from a second location in the first room;
   sort the first plurality of rays into a second plurality of ray groups, wherein each group of rays in the second plurality comprises a plurality of coherent rays;
   simulate the launch of the second plurality of ray groups into the first room from the second location using at least one computer core of the two or more computer cores; and
   detect rays from the second plurality of ray groups that return to the first detector.

18. The device of claim 17, wherein the one or more programmable control devices are further configured to:
   calculate a mean free path for the first room based, at least in part, on the launched rays and a number of surfaces in the first room that the launched rays collided with.

19. The device of claim 18, wherein the one or more programmable control devices are further configured to:
   estimate a room volume for the first room based on the calculated mean free path for the first room.

20. The device of claim 17, wherein the one or more programmable control devices are further configured to:
   combine stored information from each of the two or more computer cores in a non-redundant fashion.

* * * * *